(12) United States Patent
Kang et al.

(10) Patent No.: US 6,806,183 B2
(45) Date of Patent: Oct. 19, 2004

(54) METHODS FOR FORMING CAPACITORS ON SEMICONDUCTOR SUBSTRATES

(75) Inventors: Chang-seok Kang, Kyungki-do (KR);
Doo-sup Hwang, Kyungki-do (KR);
Cha-young Yoo, Kyungki-do (KR);
Young-wook Park, Kyungki-do (KR);
Hong-bae Park, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/295,348

(22) Filed: Nov. 15, 2002

(65) Prior Publication Data

US 2003/0096472 A1 May 22, 2003

Related U.S. Application Data

(62) Division of application No. 09/665,208, filed on Sep. 18, 2000.

(30) Foreign Application Priority Data

Sep. 16, 1999 (KR) .............................. 99-39839

(51) Int. Cl.[7] ......................................... H01L 21/4763
(52) U.S. Cl. ...................... 438/627; 438/643; 438/648; 438/653; 438/656
(58) Field of Search ................................. 438/627, 643, 438/653, 656, 660, 663, 685, 239, 785

(56) References Cited

U.S. PATENT DOCUMENTS

| | | | |
|---|---|---|---|
| 5,534,069 A | 7/1996 | Kuwabara et al. ........... 118/719 |
| 5,597,754 A * | 1/1997 | Lou et al. ..................... 438/398 |
| 5,863,327 A * | 1/1999 | Thakur ....................... 118/50.1 |
| 5,910,218 A | 6/1999 | Park et al. ................... 118/719 |
| 5,972,161 A | 10/1999 | Kim et al. ................... 156/345 |
| 5,989,999 A * | 11/1999 | Levine et al. ............... 438/627 |
| 6,013,576 A | 1/2000 | Oh et al. ..................... 438/648 |
| 6,029,602 A | 2/2000 | Bhatnagar ............ 118/723 ME |
| 6,039,770 A | 3/2000 | Yang et al. ................. 29/25.01 |
| 6,040,582 A | 3/2000 | Kim ....................... 250/492.21 |
| 6,055,927 A | 5/2000 | Shang et al. ......... 118/723 ME |
| 6,073,636 A | 6/2000 | Kim et al. ................... 134/1.3 |
| 6,074,486 A | 6/2000 | Yang et al. ................. 118/719 |
| 6,074,519 A | 6/2000 | Lee et al. .................... 156/345 |
| 6,096,592 A * | 8/2000 | Cho ........................... 438/238 |
| 6,133,086 A * | 10/2000 | Huang et al. ............... 438/240 |
| 6,155,198 A * | 12/2000 | Danek et al. ............ 118/723 E |
| 6,204,203 B1 * | 3/2001 | Narwankar et al. ......... 438/785 |
| 6,207,005 B1 | 3/2001 | Henley et al. .............. 156/345 |
| 6,281,122 B1 * | 8/2001 | Thakur ....................... 438/676 |
| 6,281,511 B1 * | 8/2001 | Thakur ...................... 250/492.2 |
| 6,291,343 B1 * | 9/2001 | Tseng et al. ................ 438/653 |
| 6,303,518 B1 * | 10/2001 | Tian et al. ................... 438/758 |
| 6,383,951 B1 * | 5/2002 | Li ............................... 438/781 |
| 6,426,308 B1 * | 7/2002 | Park et al. ................... 438/785 |
| 6,576,528 B1 * | 6/2003 | Lee et al. .................... 438/398 |

FOREIGN PATENT DOCUMENTS

| | | | |
|---|---|---|---|
| JP | 8064763 | 8/1996 | .......... H01L/27/04 |
| KR | 1999-0055181 | 7/1999 | .......... H01L/21/31 |
| KR | 1999-0055204 | 7/1999 | .......... H01L/27/10 |

* cited by examiner

*Primary Examiner*—Michael Lebentritt
(74) *Attorney, Agent, or Firm*—Myers Bigel Sibley & Sajovec, PA

(57) ABSTRACT

Methods and apparatus for plasma annealing layers of a microelectronic capacitor on a substrate are provided to improve the leakage current characteristics of a capacitor and/or to reduce the number of impurities in an electrode.

21 Claims, 19 Drawing Sheets

METHODS FOR FORMING CAPACITORS ON SEMICONDUCTOR SUBSTRATES

RELATED APPLICATION

This application is a divisional of U.S. application Ser. No. 09/665,208, filed Sep. 18, 2000, which claims priority to Korean Application No. 99-39839, filed Sep. 16, 1999, the disclosures of which are incorporated by reference herein in their entireties.

FIELD OF THE INVENTION

The present invention relates to apparatus and methods for forming films on substrates, and more particularly, to apparatus having multiple-chambers for forming thin films on semiconductor substrates and methods of using such apparatus to form capacitors on semiconductor substrates.

BACKGROUND OF THE INVENTION

As the device density on semiconductor substrates increases resulting in highly integrated semiconductor devices, it may be desirable to increase capacitance in a restricted cell area. Various methods have been proposed, for example, decreasing the thickness of the dielectric layer, increasing the effective surface areas of electrodes, and/or using dielectric layers having large dielectric constants such as ferroelectric materials. As used herein, dielectric layers having large dielectric constants including ferroelectric films are referred to as high dielectric layers.

A ferroelectric material such as $PbZrTiO_3$ (PZT) or $BaSrTiO_3$ (BST) may be used as the high dielectric layer. Unlike a silicon oxide layer, a silicon nitride layer, or a tantalum oxide layer, the ferroelectric material may exhibit a spontaneous polarization phenomenon. The ferroelectric material also typically has a dielectric constant between several hundreds and several thousands. Therefore, since the equivalent oxide thickness of the high dielectric layer is equal to or less than 10 Å even though the high dielectric layer is formed to a thickness of 500 Å, it may be possible to significantly increase capacitance when the high dielectric layer is used for a capacitor.

When a capacitor of a highly integrated semiconductor device is formed, the high dielectric layer such as BST or PZT preferably has a high dielectric constant and an excellent step coverage. The resulting capacitor preferably has an excellent leakage current characteristic. To achieve this, a metal organic chemical vapor deposition (MOCVD) method is typically used to form the high dielectric layer.

However, when the high dielectric layer such as the BST layer formed by the MOCVD method is applied to the capacitor, the high dielectric layer is typically formed at a high temperature of more than about than 500° C. in order to improve the leakage current characteristic of the capacitor. While the leakage current characteristic of the resulting capacitor may be good, the step coverage of a high dielectric layer formed at the high temperature may be less than about 50%, which is generally considered to be poor. When the step coverage of the high dielectric layer is poor, the high dielectric layer may not be suitable for use in a highly integrated semiconductor device, which has a distance between storage electrodes (the lower electrodes of the capacitor) that is relatively narrow. Also, when the high dielectric layer is formed at the high temperature of more than about 500° C., a barrier metal layer may be oxidized.

To solve the above problems, the high dielectric layer may be deposited at a low temperature of less than about 500° C. where the step coverage of the high dielectric layer is good. However, when the high dielectric layer is deposited at the low temperature, post-annealing may be required because the high dielectric layer is deposited as an amorphous layer having a dielectric constant of less than about 50. Additionally, the leakage current characteristic of the capacitor may deteriorate since impurities may remain in the dielectric layer. These impurities may be, for example, a carbon component generated from an organic metal source that is used as the raw material of the high dielectric layer.

In order to remove the impurities which may remain in the high dielectric layer, a method of crystallization annealing the high dielectric layer at a high temperature of greater than about 600° C. may be provided after depositing the high dielectric layer at the low temperature of less than about 500° C. However, when the high dielectric layer is crystallization annealed at the high temperature of greater than about 600° C., the electrode of the semiconductor device capacitor and the barrier metal layer may be oxidized and the high dielectric layer may deteriorate. Also, the remaining impurities may not be removed even though the high dielectric layer deposited at the low temperature of less than about 500° C. is crystallization annealed at the high temperature of more than about 600° C.

SUMMARY OF THE INVENTION

According to embodiments of the present invention, methods and apparatus for oxygen radical annealing or plasma annealing various layers (e.g., a lower electrode, a dielectric layer, or an upper electrode) of a microelectronic capacitor on a substrate are provided. By oxygen radical or plasma annealing the lower electrode of the capacitor, the leakage current characteristic of the capacitor may be improved such that the leakage current is reduced, for example, by a factor of 100 or more. The amount of impurities on the lower electrode may also be reduced. Oxygen radical or plasma annealing the dielectric layer of the capacitor may improve the leakage current characteristics of the capacitor and may reduce the amount of impurities in the dielectric layer. By oxygen radical annealing the upper electrode, the leakage current characteristic of the capacitor may be improved and the number of oxygen vacancies formed in the dielectric layer may be reduced.

In a first aspect, embodiments of the present invention provide an apparatus for forming a thin film on a substrate having a multi-functional chamber for depositing a dielectric layer on the substrate and an oxygen radical or plasma annealing unit connected to the multi-functional chamber. The oxygen radical or plasma annealing unit provides oxygen radical or plasma gas to the multi-functional chamber to oxygen radical or plasma anneal one or more electrodes and/or dielectric layers on the substrate in the multi-functional chamber.

In other embodiments of the present invention, the oxygen radical or plasma annealing unit is an ozone generator or a plasma generator. The plasma generator is capable of generating a plasma gas selected from the group consisting of $O_2$, $NH_3$, Ar, $N_2$, and $N_2O$. The multi-functional chamber includes an ozone or plasma gas remover connected to an exhaust end of the multi-functional chamber.

In still other embodiments of the present invention, the multi-functional chamber includes a support plate configured to hold the substrate, a heater unit positioned under the support plate, a source dispersion device positioned above the support plate configured to uniformly disperse organic source liquid, and a source supplier in fluid communication with the source dispersion device. The source supplier includes a liquid mass flow controller configured to control a flow of organic source liquid, an evaporator in fluid communication with the flow controller configured to evaporate the source liquid, and a transfer gas source in fluid communication with the evaporator configured to transfer an organic source from the evaporator to the source dispersion device. The source supplier includes between 1 and 3 evaporators.

In yet other embodiments of the present invention, the apparatus includes a cleaning gas supplier in fluid communication with the multi-functional chamber configured to supply cleaning gas to remove dielectric material from a wall of the multi-functional chamber. The apparatus includes a transfer chamber configured to transfer the substrate from a first chamber to a second chamber. The multi-functional chamber is connected to the transfer chamber. The apparatus includes a loadlock chamber configured to introduce the substrate into the apparatus. The loadlock chamber is connected to the transfer chamber. The apparatus includes an electrode deposition chamber, a crystallization annealing chamber, an oxygen radical or plasma annealing chamber configured to pre-treat a lower electrode, and/or a cooling chamber and a pre-heating chamber, each of which is connected to the transfer chamber.

In another aspect, embodiments of the present invention provide an apparatus for forming a thin film on a substrate having a crystallization annealing chamber for processing a substrate, and an oxygen radical or plasma annealing unit connected to the crystallization annealing chamber. The oxygen radical or plasma annealing unit provides oxygen radical or plasma gas to the crystallization annealing chamber to oxygen radical or plasma anneal an electrode or dielectric layer on the substrate in the crystallization annealing chamber.

In other embodiments of the present invention, the apparatus includes a transfer chamber configured to transfer the substrate from a first chamber to a second chamber. The crystallization chamber is connected to the transfer chamber. The apparatus includes a loadlock chamber configured to introduce the substrate into the apparatus, a dielectric layer deposition chamber, and/or an electrode deposition chamber, each of which is connected to the transfer chamber.

In still another aspect, embodiments of the present invention provide an apparatus for forming a thin film on a substrate having an oxygen radical or plasma annealing chamber configured to post-treat a dielectric layer and/or an upper electrode, and an oxygen radical or plasma annealing unit connected to the oxygen radical or plasma annealing chamber. The oxygen radical or plasma annealing unit provides oxygen radical or plasma gas to the oxygen radical or plasma annealing chamber to oxygen radical or plasma anneal a dielectric layer and/or an upper electrode on the substrate in the oxygen radical or plasma annealing chamber.

In other embodiments of the present invention, the apparatus includes a transfer chamber configured to transfer the substrate from a first chamber to a second chamber. The oxygen radical or plasma annealing chamber configured to post-treat a dielectric layer and/or an upper electrode is connected to the transfer chamber. The apparatus includes a loadlock chamber for introducing the substrate to the apparatus, a dielectric layer deposition chamber, and/or an electrode deposition chamber, each of which is connected to the transfer chamber. The apparatus includes an oxygen radical or plasma annealing chamber configured to pre-treat a lower electrode, a crystallization annealing chamber, and/or a cooling chamber and a pre-heating chamber, each of which is connected to the transfer chamber.

Embodiments of the present invention also provide methods for forming a capacitor on a substrate including the operations of forming a lower electrode on a substrate, forming a dielectric layer on the lower electrode, oxygen radical or plasma annealing the dielectric layer, and forming an upper electrode on the oxygen radical or plasma annealed dielectric layer.

In other embodiments of the present invention, the operations of forming a dielectric layer and oxygen radical or plasma annealing the dielectric layer are performed in the same chamber. The oxygen radical annealing of the dielectric layer includes the operation of exposing the dielectric layer to an atmosphere including an oxygen radical, which may be ozone, and maintaining the temperature of the dielectric layer equal to or less than 500° C. during the exposing operation. The plasma annealing of the dielectric layer includes the operation of exposing the dielectric layer to an atmosphere comprising a plasma gas, such as $O_2$, $NH_3$, Ar, $N_2$, and $N_2O$, and maintaining the temperature of the dielectric layer equal to or less than 500° C. during the exposing operation. The operations of forming and oxygen radical or plasma annealing the dielectric layer may be performed repeatedly. The dielectric layer may be various dielectric materials, such as $Ta_2O_5$, $Al_2O_3$, $TiO_2$, $Y_2O_3$, $SrTiO_3$, $BaTiO_3$, $SrTiO_3$, $PbZrTiO_3$, $SrBi_2Ta_2O_9$, $PbZrO_3$, $LaZrO_3$, $PbTiO_3$, $LaTiO_3$, and $Bi_4Ti_3O_{12}$.

In still other embodiments of the present invention, the methods include the operation of oxygen radical or plasma annealing the lower electrode. Oxygen radical or plasma annealing the lower electrode, depositing the dielectric layer, and oxygen radical or plasma annealing the dielectric layer are performed in the same chamber. Oxygen radical or plasma annealing the lower electrode, forming the dielectric layer, oxygen radical or plasma annealing the dielectric layer, and forming the upper electrode are performed in-situ by one apparatus for forming a thin film.

In yet other embodiments, the methods include the crystallization annealing of the dielectric layer after forming the upper electrode. The operations of oxygen radical or plasma annealing the lower electrode, forming the dielectric layer, oxygen radical or plasma annealing the dielectric layer, forming the upper electrode, and crystallization annealing the dielectric layer are performed in-situ by one apparatus for forming a thin film.

In other embodiments of the present invention, the methods include the operation of crystallization annealing the dielectric layer after oxygen radical or plasma annealing the dielectric layer. The oxygen radical or plasma annealing of the dielectric layer and the crystallization annealing of the dielectric layer are performed in the same chamber. The operations of forming the dielectric layer, oxygen radical or plasma annealing the dielectric layer, crystallization annealing the dielectric layer, and forming the upper electrode are performed in-situ by one apparatus for forming a thin film.

In another aspect, embodiments of the present invention provide methods for forming a capacitor on a substrate including the operations of forming a lower electrode on a substrate, forming a dielectric layer on the lower electrode, forming a first upper electrode on the dielectric layer, and oxygen radical annealing the upper electrode.

In other embodiments of the present invention, the oxygen radical annealing operation includes the operations of exposing the upper electrode to an atmosphere containing ozone, and maintaining the temperature of the upper electrode at equal to or less than 500° C. during the exposing operation. The methods include forming a second upper electrode on the oxygen radical annealed first upper electrode.

As described above, apparatus and methods according to the present invention may form capacitors having improved current leakage characteristics. Impurities and defects in one or more layers of the capacitors may also be reduced while maintaining the improved current leakage characteristics.

DESCRIPTION OF PREFERRED EMBODIMENTS

Figure 1:
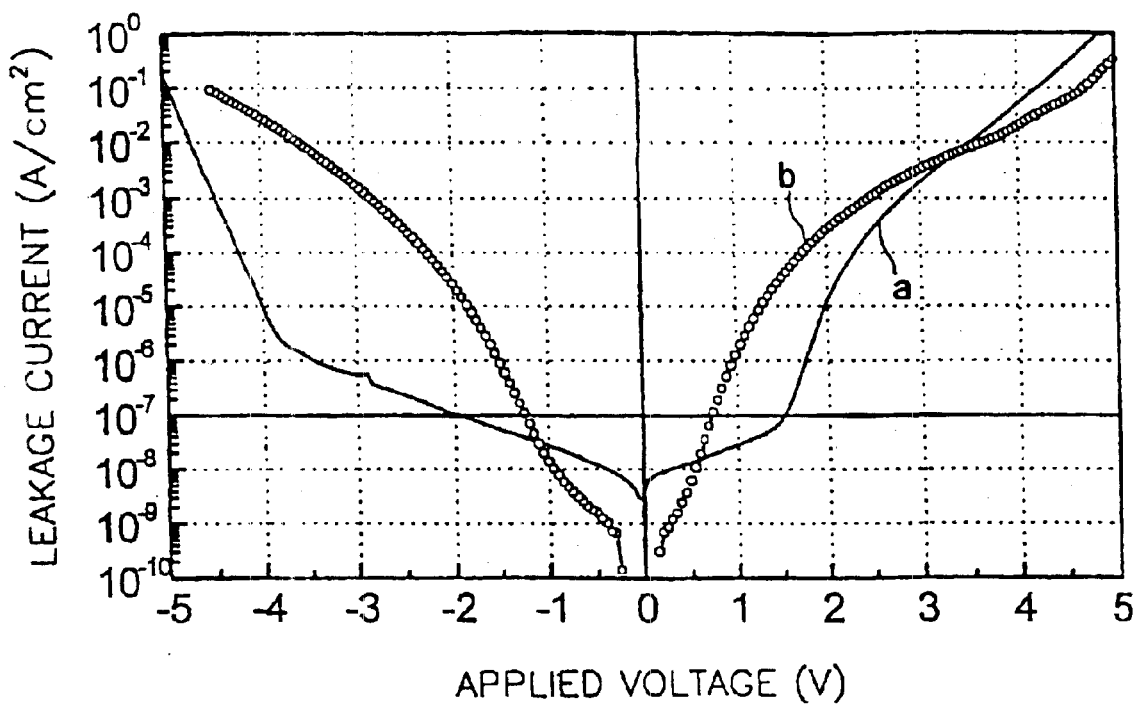
FIG. 1 is a graph illustrating a comparison of the leakage current of a capacitor having a high dielectric layer ozone annealed according to embodiments of the present invention versus the leakage current of a capacitor formed without such ozone annealing.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. As used herein, "in situ" means performing various processes without exposing the workpiece to an environment that may contaminate it, such as air.

According to embodiments of the present invention, it is now possible to manufacture thin films and capacitors on substrates, preferably semiconductor substrates, such that the thin films have lower impurity levels and the capacitors have improved electrical characteristics (e.g., an improved leakage current characteristic). As used herein, capacitors are devices having a lower electrode on the substrate, a dielectric layer on the lower electrode, and an upper electrode on the dielectric layer. The dielectric layer is preferably a high dielectric layer, such as $Ta_2O_5$, $Al_2O_3$, $TiO_2$, $Y_2O_3$, $SrTiO_3$ (STO), $BaTiO_3$, $SrTiO_3$, $PbZrTiO_3$ (PZT), $SrBi_2Ta_2O_9$ (SBT), $PbZrO_3$, $LaZrO_3$, $PbTiO_3$, $LaTiO_3$, and $Bi_4Ti_3O_{12}$. Hereinafter, a BST layer having a perovskite structure is used as an example of the high dielectric layer.

Apparatus and methods of embodiments of the present invention may reduce the amount of impurities such as carbon and carbon dioxide, which may remain on the lower electrode or in the dielectric layer when the lower electrode is oxygen radical or plasma annealed or the high dielectric layer is oxygen radical annealed, respectively. Also, oxygen radical annealing the upper electrode may limit the formation of oxygen vacancies in the high dielectric layer. The leakage current of the capacitor may be reduced by oxygen radical or plasma annealing the lower electrode, oxygen radical or plasma annealing the dielectric layer, or oxygen radical annealing the upper electrode. In addition to apparatus and methods for oxygen radical or plasma annealing thin films, embodiments of the present invention provide an apparatus for forming a thin film that may limit the absorption of impurities onto or into the workpiece by performing a plurality of operations, such as forming a lower electrode, oxygen radical or plasma annealing the lower electrode, forming a dielectric layer, oxygen radical or plasma annealing the dielectric layer, forming an upper layer, and/or oxygen radical annealing the upper layer, in situ.

In detail, referring now to FIG. 1, a graph illustrates a comparison of the leakage current of a capacitor having a high dielectric layer ozone annealed according to embodiments of the present invention versus the leakage current of a capacitor formed without such ozone annealing. FIG. 1 shows the leakage current characteristic of the capacitor having the following structure: a Pt layer (a lower electrode)/a BST layer (a high dielectric layer)/a Pt layer (an upper electrode). The BST layer was formed in an amorphous state to a thickness of 150 Å on the lower electrode Pt layer, which was at 420° C. In FIG. 1, reference characters a and b denote a case where the BST layer is ozone annealed and a case where the BST layer is not ozone annealed, respectively.

As shown in FIG. 1, performing the ozone annealing operation allows a larger voltage to be applied to the capacitor for a given leakage current value. Thus, the leakage current at desirable voltages is lower (i.e., the leakage current characteristic of the capacitor is improved) when the ozone annealing is performed than when the ozone annealing is not performed. The improved leakage current characteristics may be due to a decrease in the level of impurities in the BST layer when the ozone annealing is performed after forming the high dielectric layer.

Figure 2:
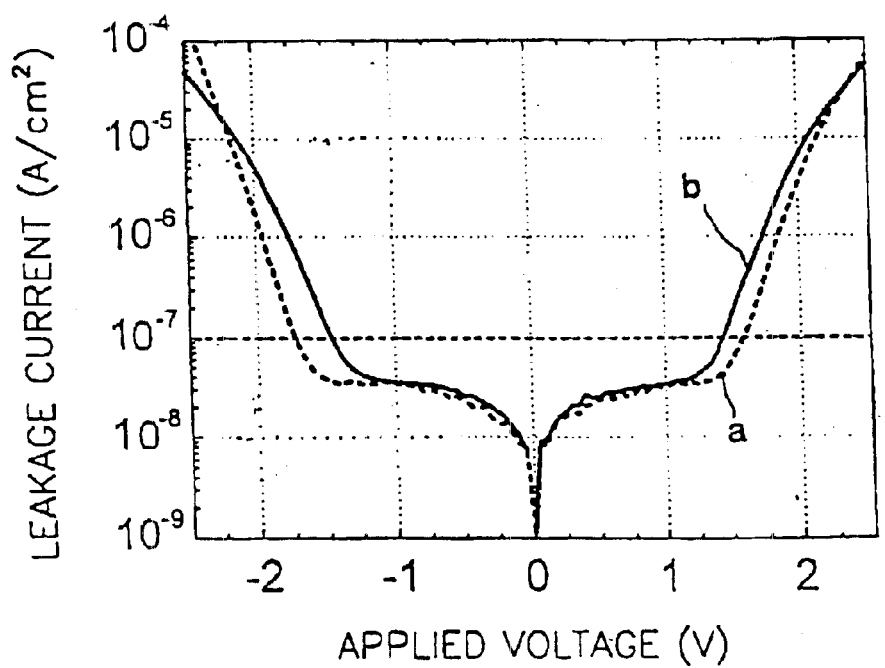
FIG. 2 is a graph illustrating a comparison of the leakage current of a capacitor having a high dielectric layer plasma annealed according to embodiments of the present invention versus the leakage current of a capacitor formed without such plasma annealing.

Referring now to FIG. 2, a graph illustrates a comparison of the leakage current of a capacitor having a high dielectric layer plasma annealed according to embodiments of the present invention versus the leakage current of a capacitor formed without such plasma annealing. FIG. 2 shows the leakage current characteristic of the capacitor having the following structure: a Pt layer (a lower electrode)/a BST layer (a high dielectric layer)/a Pt layer (an upper electrode). The BST layer was be formed in an amorphous state to a thickness of 220 Å on the lower electrode Pt layer, which was at 420° C. In FIG. 2, reference characters a and b denote a case where the plasma annealing is performed in a $N_2O$ plasma gas atmosphere after forming the BST layer and a case where the plasma annealing is not performed, respectively.

As shown in FIG. 2, performing the plasma annealing operation allows a larger voltage to be applied to the capacitor for a given leakage current value. Thus, the leakage current at desirable voltages is lower (i.e., the leakage current characteristic of the capacitor is improved) when the plasma annealing is performed than when the plasma annealing is not performed. The improved leakage current characteristics may be due to a decrease in the level of impurities in the BST layer when the plasma annealing is performed after forming the high dielectric layer.

Figure 3:
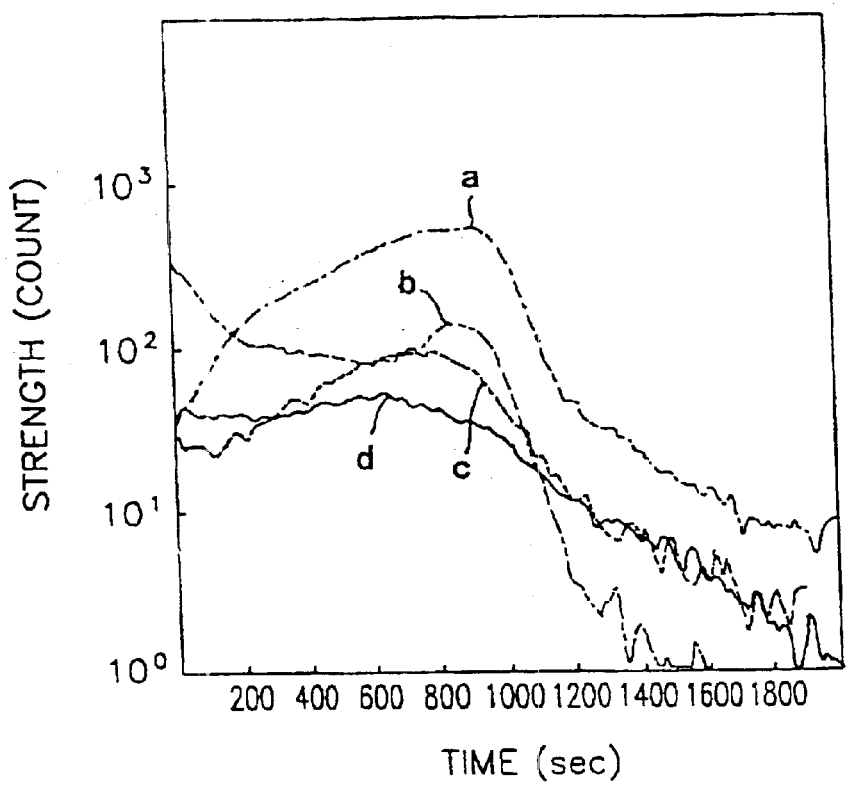
FIG. 3 is a graph illustrating a comparison of the distribution of remaining carbon impurities in a high dielectric layer ozone annealed according to embodiments of the present invention versus the level of such impurities in a high dielectric layer that was not ozone annealed.

In FIG. 3, a graph illustrates a comparison of the distribution of remaining carbon impurities in a high dielectric layer ozone annealed according to embodiments of the present invention versus the level of such impurities in a high dielectric layer that was not ozone annealed. Impurities such as carbon may remain in the BST layer deposited in an amorphous state at a low temperature equal to or less than 500° C. Table 1 shows how carbon impurities are distributed for various annealing conditions. Carbon distribution was measured using a time of flight-secondary ion mass spectroscopy (TOF-SIMS) of a BST layer having a thickness of 150 Å in the amorphous state.

TABLE 1

| Sample | Deposition thickness and temperature of BST layer | Annealing conditions after depositing BST layer |
| --- | --- | --- |
| a | 150 Å/420° C. | Not annealed |
| b | 150 Å/420° C. | $N_2 + O_2(5\%)$ annealed at 650 ° C. for 30 minutes |
| c | 150 Å/420° C. | Ozone annealed at 350° C. |
| d | 150 Å/420° C. | Ozone annealed at 350° C. and $N_2 + O_2(5\%)$ annealed at 650° C. for 30 minutes |

As shown in FIG. 3, the amount of carbon detected from the ozone annealed samples c and d is smaller than the amounts of carbon detected from other non-ozone annealed samples. As less carbon remains in the ozone annealed dielectric layer, the leakage current characteristic of capacitors formed with such layers may be improved.

The leakage current may be reduced by decreasing the impurities such as $CO_2$ and C absorbed into the lower electrode because the leakage current of the capacitor of the semiconductor device constituted of the lower electrode/the high dielectric layer/the upper electrode may be suppressed by the shottky barrier generated by the difference between the work function of the electrode and the work function of the high dielectric layer.

Figure 4:
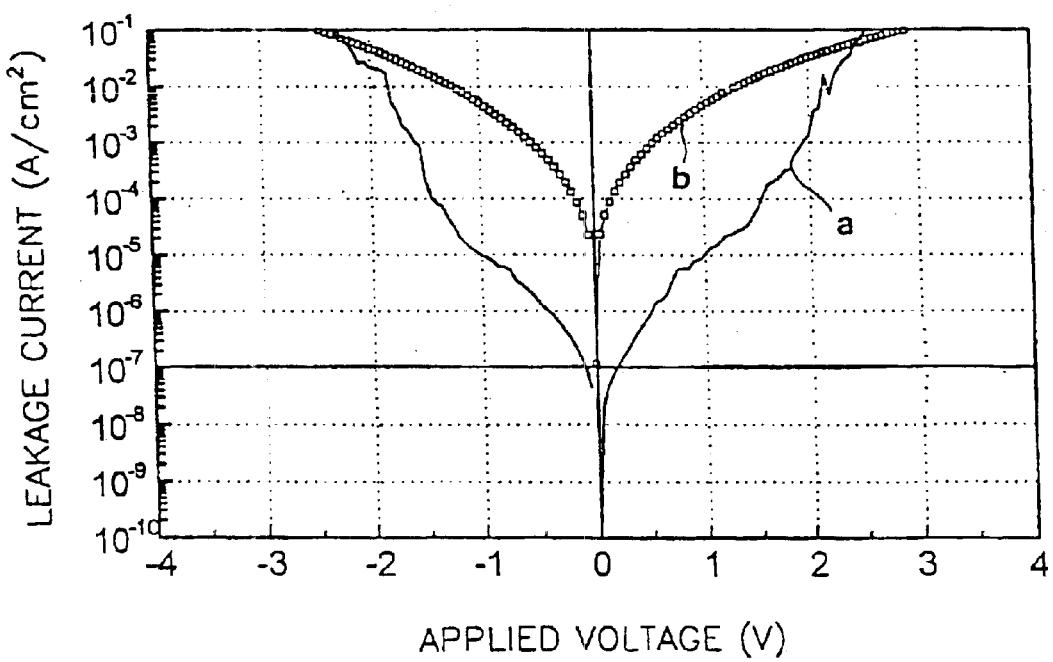
FIG. 4 is a graph illustrating a comparison of the leakage current of a capacitor having a lower electrode ozone annealed according to embodiments of the present invention versus the leakage current of a capacitor formed without such ozone annealing.

Referring now to FIG. 4, a graph illustrates a comparison of the leakage current of a capacitor having a lower electrode ozone annealed according to embodiments of the present invention versus the leakage current of a capacitor formed without such ozone annealing. FIG. 4 shows the leakage current characteristic of the capacitor having the following structure: a Ru layer (a lower electrode)/a BST layer (a high dielectric layer)/a Ru layer (an upper electrode). In FIG. 4, reference characters a and b denote a case where the lower electrode is ozone annealed and a case where the lower electrode is not ozone annealed, respectively. The lower electrode is ozone annealed at a temperature of 350° C. with gas having an ozone density of 10% for 5 minutes.

As shown in FIG. 4, the leakage current is $1 \times 10^{-5}$ A/cm$^2$ at 1.0 V when the lower electrode is oxygen radical annealed by ozone according to embodiments of the present invention, and the leakage current is $5 \times 10^{-3}$ A/cm$^2$ at 1.0 V when the lower electrode is not oxygen radical annealed by ozone. Thus, by use of embodiments of the present invention, the leakage current may be reduced, for example, by a factor of about 100. This improvement in leakage current characteristic may be caused by a reduction in the level of impurities on the oxygen radical annealed lower electrode.

Figure 5:
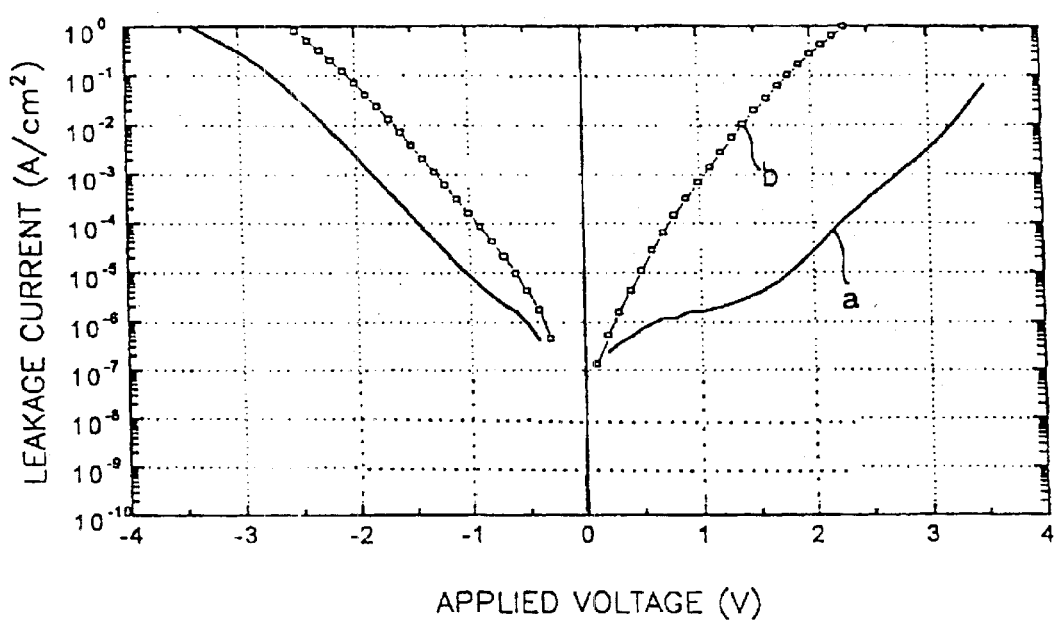
FIG. 5 is a graph illustrating a comparison of the leakage current of a capacitor having an upper electrode deposited in an oxygen atmosphere according to embodiments of the present invention versus the leakage current formed without such deposition.

Referring now to FIG. 5, a graph illustrates a comparison of the leakage current of a capacitor having an upper electrode deposited in an oxygen atmosphere according to embodiments of the present invention versus the leakage current formed without such deposition. When thermal treatment for crystallization is performed and the upper electrode is formed at the same time in a reducing atmosphere at high temperature, for example in an $N_2$ atmosphere at a temperature equal to or more than 650° C., the leakage current of the resulting capacitor may increase because oxygen vacancies may be easily formed in the BST layer, allowing the Pt of the upper electrode to migrate. According to embodiments of the present invention, oxygen is added during the formation of the upper electrode, which may improve the electrical characteristics of the capacitor.

FIG. 5 shows the leakage current characteristic of a capacitor having the following structure: a Pt layer (the lower electrode)/a BST layer (the high dielectric layer)/a Pt layer (the upper electrode). Reference characters a and b denote a case where oxygen is added when the upper electrode is deposited in the reducing atmosphere, i.e., $N_2$ atmosphere at a temperature of 650° C., for the crystallization of the BST layer and a case where oxygen is not added, respectively.

As shown in FIG. 5, when oxygen is not added, the leakage current is $5 \times 10^{-3}$ A/cm$^2$ at 1.0 V. However, when oxygen is added, the leakage current is $2 \times 10^{-6}$ A/cm$^2$ at 1.0 V. Accordingly, the addition of oxygen according to embodiments of the present invention may reduce the leakage current by, for example, a factor of 1,000. The leakage current may be reduced when oxygen is added during the deposition of the upper electrode because the Pt of the upper electrode becomes PtO. Thus, oxygen contained in the upper electrode may prevent the formation of oxygen vacancies in the BST layer and the migration of Pt of the upper electrode during $N_2$ thermal treatment.

According to embodiments of the present invention, it may be possible to form a PtO upper electrode more easily and to strongly combine the upper electrode with the high dielectric layer when the upper electrode is deposited and is oxygen radical annealed than when oxygen is added during the formation of the upper electrode. In particular, when the upper electrode is deposited as a thin film and annealed by oxygen radical, it may be possible to lower the temperature at which the BST layer is crystallized and to improve the characteristic of an interface between the BST layer and the upper electrode. When the upper electrode is annealed in the reducing atmosphere, it may be possible to prevent the migration of Pt from the upper electrode.

Figure 6:
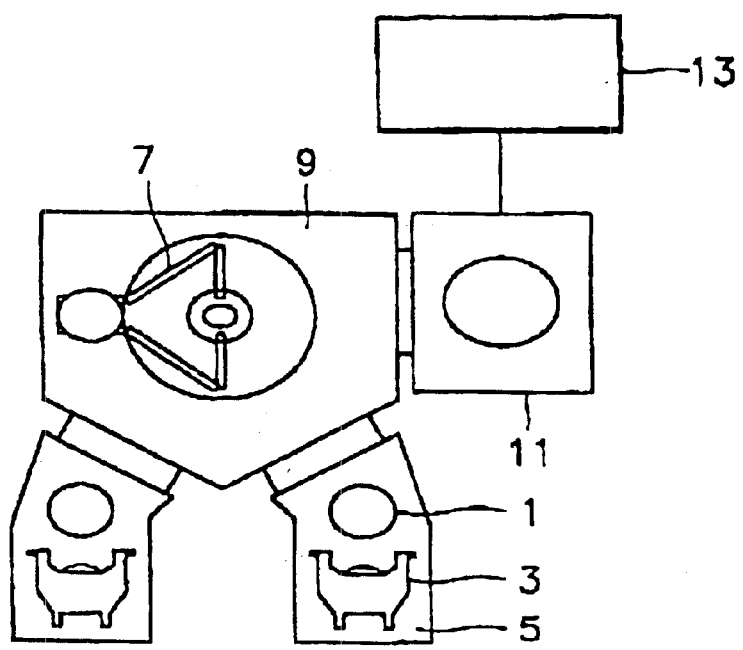
FIG. 6 is a schematic diagram illustrating embodiments of an apparatus for forming a thin film according to the present invention having a multi-functional chamber in fluid communication with an oxygen radical or plasma annealing unit.

Referring now to FIG. 6, embodiments of an apparatus for forming a thin film according to the present invention having a multi-functional chamber in fluid communication with an annealing unit will now be described. While apparatus of embodiments of the present invention may form various thin films, it is preferable that they form the thin films of capacitors on highly integrated semiconductor substrates. These thin films may include the lower electrodes, dielectric layers, and upper electrodes of capacitors on semiconductor substrates. The apparatus includes a loadlock chamber 5 having a cassette 3 loaded with one or more semiconductor wafers 1 (a semiconductor substrate). The loadlock chamber 5 is connected to a transfer chamber 9. The transfer chamber 9 may be used to transfer the semiconductor wafer 1 from a first chamber within the apparatus to a second chamber within the apparatus. While the transfer chamber 9 as illustrated in FIG. 6 has robot arms 7 for loading and unloading the semiconductor wafer 1, it is to be understood that various means for loading and unloading the semiconductor wafer 1 may be used.

As shown in FIG. 6, the transfer chamber 9 is connected to a multi-functional chamber 11, which is connected to an oxygen radical or plasma annealing unit 13. The oxygen radical or plasma annealing unit 13 may be an oxygen radical generator (e.g., an ozone generator) or a plasma generator. The multi-functional chamber 11 can oxygen radical or plasma anneal a lower electrode, oxygen radical or plasma anneal a high dielectric layer, or oxygen radical anneal an upper electrode using oxygen radicals or plasma provided by the oxygen radical or plasma annealing unit 13. The multi-functional chamber can also deposit the dielectric layer. By performing multiple operations in the multi-functional chamber 11, it may be possible to reduce the time required for loading and unloading the semiconductor wafer, pre-heating and cooling the semiconductor wafer, and moving the semiconductor wafers to individual chambers. Accordingly, apparatus of embodiments of the present invention may reduce some of the expenses incurred in manufacturing semiconductor devices. For example, apparatus of embodiments of the present invention may reduce equipment expenses and promote clean room efficiency by using only one transfer chamber.

Figure 8:
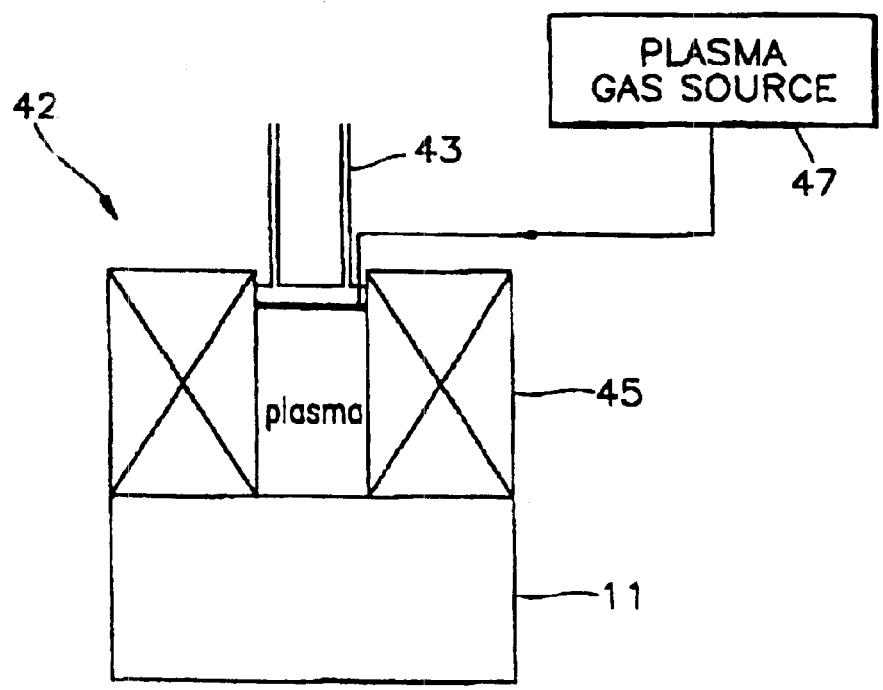
FIG. 8 is a schematic diagram illustrating embodiments of the multi-functional chamber shown in FIG. 6 and having a plasma generator as a plasma annealing unit.

The multi-functional chamber 11 connected to the oxygen radical or plasma unit 13 annealing such as the ozone generator or the plasma generator will be described in detail with reference to FIGS. 7 and 8. Although FIG. 7 shows a multi-functional chamber capable of performing ozone annealing and FIG. 8 shows a multi-functional chamber capable of performing plasma annealing, it is to be understood that multi-functional chambers of embodiments of the present invention may be capable of performing both ozone annealing and plasma annealing.

Figure 7:
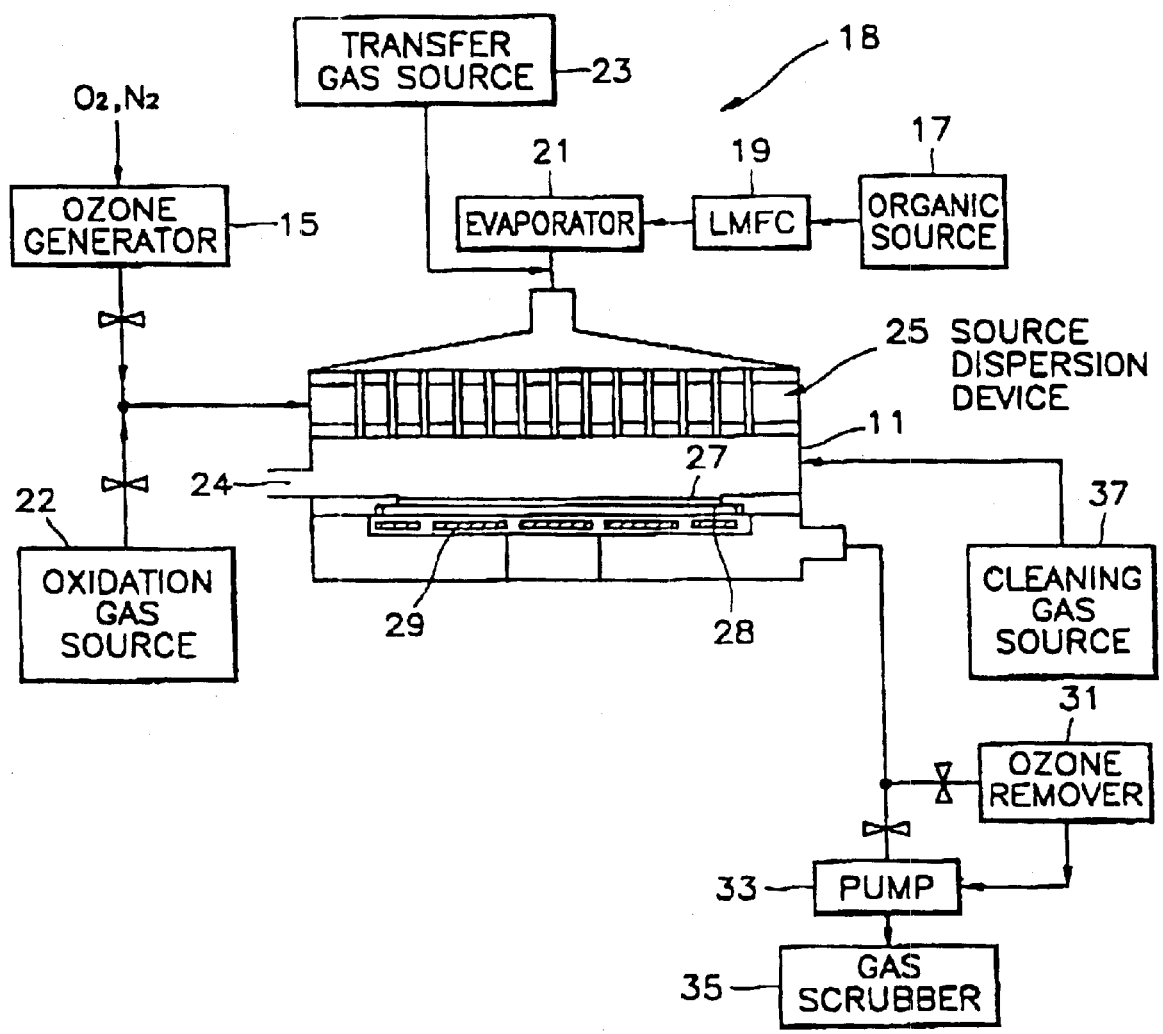
FIG. 7 is a schematic diagram illustrating embodiments of the multi-functional chamber shown in FIG. 6 and having an ozone generator as an oxygen radical annealing unit.

Turning now to FIG. 7, embodiments of the multi-functional chamber connected to an annealing unit of FIG. 6 having an ozone generator as the oxygen radical annealing unit will now be described. The multi-functional chamber 11 has a supporting plate 28 that holds a semiconductor wafer 27 (a semiconductor substrate). The semiconductor wafer 27 is loaded into the multi-functional chamber through an entrance 24. A heater 29 for controlling the temperature of the semiconductor wafer between 300 and 700° C. is positioned under the support plate in the lower portion of the multi-functional chamber 11. The heater 29 preferably has the form of a lamp which can rapidly increase and decrease the temperature when the deposition temperature of the high dielectric layer is different from the oxygen radical or plasma annealing temperature of the lower electrode and/or the oxygen radical or plasma annealing temperature of the high dielectric layer. A source dispersion device 25 is positioned above the supporting plate 28. The source dispersion device 25, preferably a shower head, is in fluid communication with a source supplier 18, which supplies source gas for forming a dielectric layer.

As shown in FIG. 7, the source supplier 18 includes an organic source 17, a flow controller 19, an evaporator 21, and a transfer gas source 23. The organic source 17 supplies an organic source solution. As will be understood by those skilled in the art, the organic source solution may include various dielectric sources such as Ba(tetra methyl heptadionate [THD])$_2$ solution, Sr(THD)$_2$ solution, and Ti(THD)$_2$(O-i-C$_3$H$_7$)$_2$ solution. Various solvents may be used to dissolve the organic source including, but not limited to, tetra hydro furan (THF), nBbutyl acetate, acetone, and alcohol. In the present embodiment, a BST layer is used as the high dielectric layer. However, when a Ta$_2$O$_5$ layer is used as the high dielectric layer, Ta(O—C$_2$H$_5$)$_5$ may be used as the source.

As illustrated in FIG. 7, the organic source 17 is in fluid communication with a flow controller 19, which is preferably a liquid mass flow controller (LMFC). The flow controller 19 is in fluid communication with an evaporator 21, which evaporates the liquid organic source. A transfer gas source 23 is in fluid communication with the evaporator 21. The transfer gas source 23 supplies transfer gas such as Ar gas, which mixes with the evaporated source to form evaporated source gas and transfers the organic source from the evaporator 21 to the source dispersion device 25. While the apparatus illustrated in FIG. 7 shows one evaporator 21, it is to be understood that one, two, or three evaporators may be used. The source dispersion device 25 disperses the evaporated source gas into the multi-functional chamber 11. Preferably, the evaporated source gas is dispersed uniformly. An oxidation gas source 22 configured to supply oxidation gas that reacts with the evaporated source gas to form the high dielectric layer is connected to the multi-functional chamber 11.

An ozone generator 15, which is used as the oxygen radical annealing unit, is connected to the multi-functional chamber 11 for performing an ozone annealing process in an atmosphere containing oxygen radical. The ozone generator 15 generates ozone using a gas mixture of oxygen and nitrogen as input gas. The flow rate of input gas is preferably between 1,000 sccm (standard cubic centimeter per minute) and 10 slm (standard liter per minute). The input gas preferably has a nitrogen concentration between 1 and 30%. The ozone density of the resulting ozone gas is preferably between 0.1 and 10 vol %. The ozone annealing process is performed by flowing generated ozone into the multi-functional chamber 11. Used ozone gas is removed through an ozone remover 31, a pump 33, and a gas scrubber 35 installed in the exhaust end of the multi-functional chamber 11 and is finally exhausted to the outside. The pump 33 preferably controls the pressure of the multi-functional chamber 11 in a range between 0.1 and 10 Torr.

An ultraviolet ray (UV) lamp (not shown) can be additionally installed above the semiconductor wafer, for example, in the lower end of the shower head. The UV rays may improve the efficiency of the ozone annealing process. A cleaning gas source 37 configured to supply cleaning gas such as ClF$_3$ for cleaning the external wall of the multi-functional chamber 11 is connected to the multi-functional chamber 11.

Referring now to FIG. 8, a multi-functional chamber connected to a plasma generator will now be described. The multi-functional chamber 11 is capable of forming a dielectric layer as described above with respect to FIG. 7, but utilizes a plasma generator rather than an ozone generator as an annealing unit.

As illustrated in FIG. 8, the plasma generator 42 includes a wave guide 43, magnet coils 45, and a plasma gas source 47. O$_2$, NH$_3$, Ar, N$_2$, or N$_2$O gas flows from the plasma gas source 47, and plasma of O$_2$, NH$_3$, Ar, N$_2$, or N$_2$O is generated between the magnetic coils 45. Generated plasma enters the multi-functional chamber 11. The plasma generator 42 preferably generates ECR plasma using a microwave of 2.54 Ghz. However, the plasma generator may generate RF (Radio Frequency) plasma of 13.56 MHZ.

Figure 9:
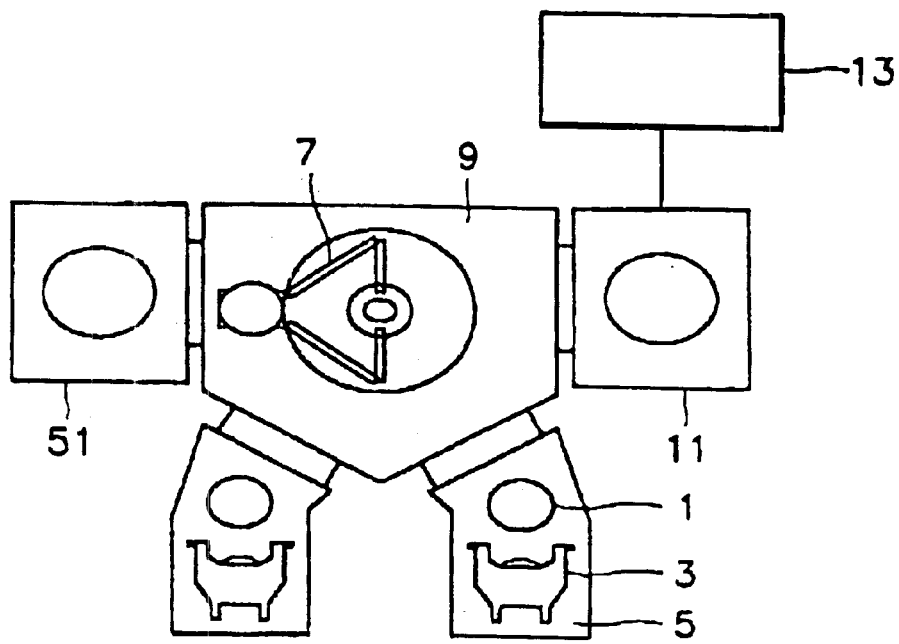
FIG. 9 is a schematic diagram illustrating embodiments of an apparatus for forming a thin film according to the present invention similar to the embodiments of FIG. 6 and having an electrode deposition chamber.

Referring now to FIG. 9, embodiments of an apparatus for forming a thin film according to embodiments of the present invention similar to the embodiments of FIG. 6 and having an electrode deposition chamber will now be described. The apparatus has an electrode deposition chamber 51 connected to the transfer chamber 9. The electrode deposition chamber 51 may be used to form a lower electrode on the semiconductor substrate and to form an upper electrode on the dielectric layer. Thus, according to embodiments of the present invention, the upper electrode can be deposited in-situ without exposing the semiconductor wafer to air after oxygen radical or plasma annealing the high dielectric layer. The apparatus may be used to perform processes of from forming the lower electrode to oxygen radical annealing the upper electrode in-situ. The electrode deposition chamber will be described more fully with reference to FIG. 10.

Figure 10:
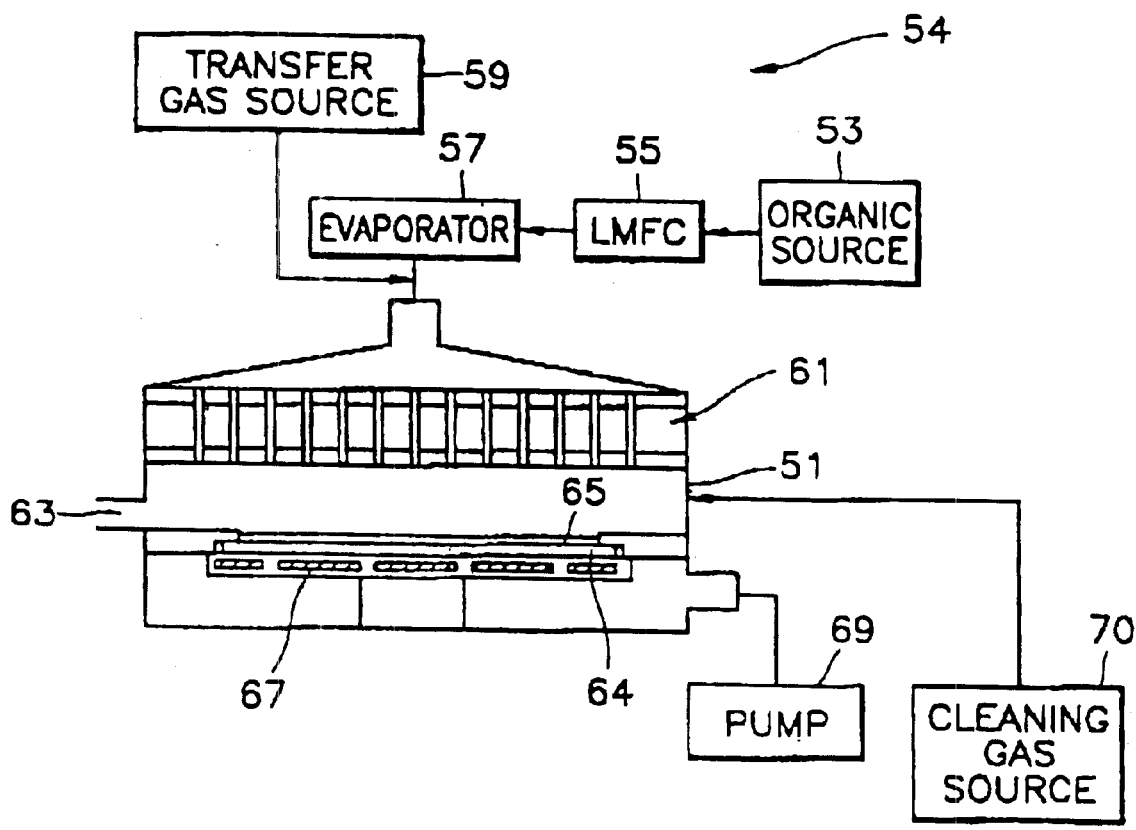
FIG. 10 is a schematic diagram illustrating embodiments of the electrode deposition chamber shown in FIG. 9.

FIG. 10 is a schematic diagram illustrating embodiments of the electrode deposition chamber 51 shown in FIG. 9. The electrode deposition chamber 51 has a supporting plate 64 that holds a semiconductor wafer 65 (a semiconductor substrate). The semiconductor wafer 65 is loaded into the electrode deposition chamber through an entrance 63. A heater 67 for controlling the temperature of the semiconductor wafer between 300 and 600° C. is positioned under the support plate in the lower portion of the electrode deposition chamber 51. A source dispersion device 61 is positioned above the supporting plate 64. The source dispersion device 61, preferably a shower head, is in fluid communication with a source supplier 54, which supplies source gas for forming an electrode.

As shown in FIG. 10, the source supplier 54 includes an organic source 53, a flow controller 55, an evaporator 57, and a transfer gas source 59. The organic source 53 supplies an organic source solution. As will be understood by those skilled in the art, the organic source solution may include various electrode sources such as bis(ethylcyclopentadienyl) ruthenium [Ru(EtCp)$_2$] and Ru(THD)$_3$ solutions. Various solvents may be used to dissolve the organic source including, but not limited to, tetra hydro furan (THF), nBbutyl acetate, acetone, and alcohol. In the present embodiment, an Ru layer is used for forming the electrode. However, a layer formed of a Pt group metal, oxide of the Pt group layer, a metal nitride, and a heat-resistant metal can be deposited in the electrode deposition chamber according to embodiments of the present invention.

As illustrated in FIG. 10, the organic source 53 is in fluid communication with a flow controller 55, Which is preferably a liquid mass flow controller (LMFC). The flow controller 55 is in fluid communication with an evaporator 57, which evaporates the liquid organic source. A transfer gas source 59 is in fluid communication with the evaporator 57. The transfer gas source 59 supplies transfer gas such as Ar gas, which mixes with the evaporated source to form evaporated source gas and transfers the organic source from the evaporator 59 to the source dispersion device 61. While the apparatus illustrated in FIG. 10 shows one evaporator 57, it is to be understood that one, two, or three evaporators may be used. The source dispersion device 61 disperses the evaporated source gas into the electrode deposition chamber 51. Preferably, the evaporated source gas is dispersed uniformly. The electrode deposition chamber 51 includes a pump for controlling the pressure of the electrode deposition chamber 51 between 0.1 and 10 Torr. A cleaning gas source 70 is connected to the electrode deposition chamber 51 configured to supply cleaning gas, for example, ClF$_3$ gas which can remove source material deposited on the wall of the electrode deposition chamber 51.

Figure 11:
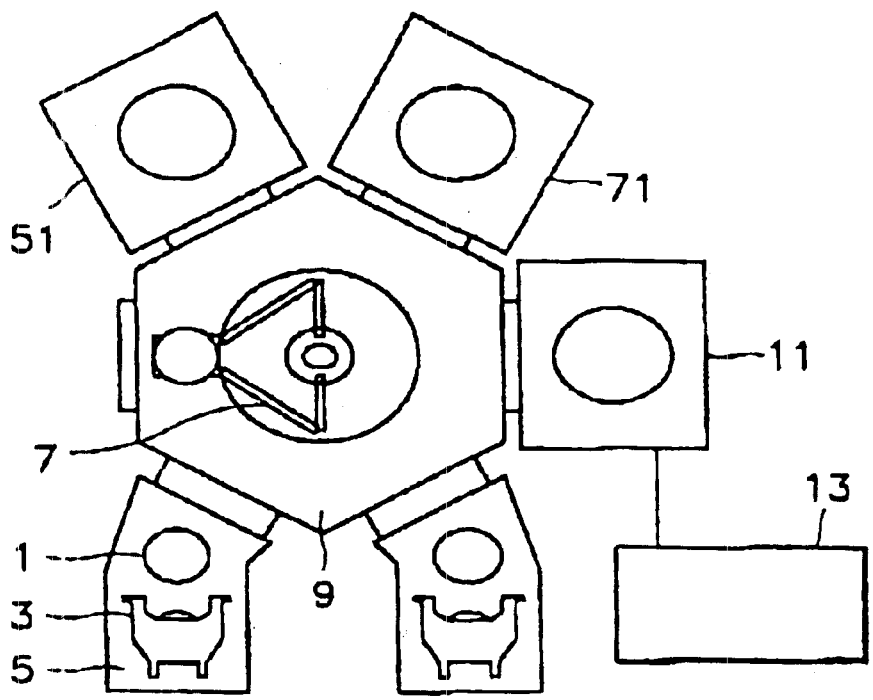
FIG. 11 is a schematic diagram illustrating embodiments of an apparatus for forming a thin film according to the present invention similar to the embodiments of FIG. 9 and having a crystallization annealing chamber.

Referring now to FIG. 11, an apparatus for forming a thin film according to embodiments of the present invention similar to the embodiments of FIG. 9 and having a crystallization annealing chamber will now be described. A crystallization annealing chamber 71 for annealing and crystallizing the dielectric layer deposited in an amorphous state at the temperature equal to or more than the crystallization temperature is connected to the transfer chamber 9. The crystallization annealing chamber 71 is preferably a rapid thermal annealing furnace in which the temperature rapidly rises and falls or a general hot wall single wafer type of furnace. The crystallization annealing chamber 71 controls the temperature of the semiconductor substrate between 300 and 900° C., the pressure between 0.1 and 760 Torr, and an atmosphere to be an oxidative atmosphere or a non-oxidative atmosphere. According to embodiments of the present invention, it is possible to perform crystallization annealing in-situ before or after depositing the upper electrode, which may reduce the level of impurities and the leakage current as described above.

Figure 12:
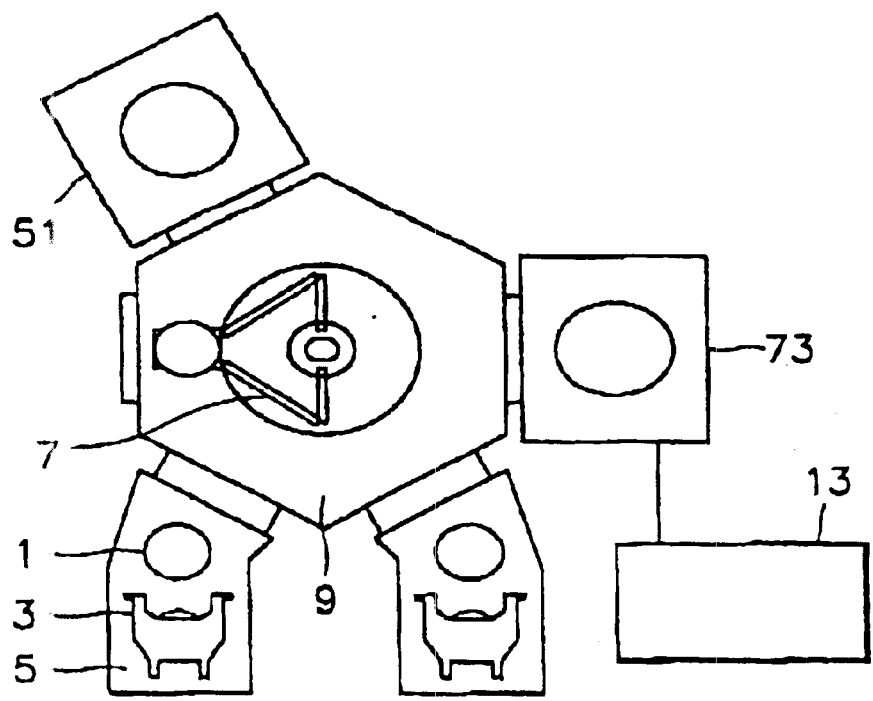
FIG. 12 is a schematic diagram illustrating embodiments of an apparatus for forming a thin film according to the present invention having a dielectric layer deposition chamber in fluid communication with an oxygen radical or plasma annealing unit and an electrode deposition chamber.

Turning now to FIG. 12, embodiments of an apparatus for forming a thin film according to embodiments of the present invention having an electrode deposition chamber and a dielectric layer deposition chamber in fluid communication with an oxygen radical or plasma annealing unit will now be described. A dielectric deposition chamber 73 is connected to the transfer chamber 9 and is in fluid communication with the oxygen radical or plasma annealing unit 13. The dielectric deposition chamber 73 has a structure similar to that of the multi-functional chamber 11 described above, and may be used for depositing a high dielectric layer, oxygen radical or plasma annealing a high dielectric layer, and/or oxygen radical annealing an upper electrode. Accordingly, it is possible to deposit the upper electrode in-situ without exposing the semiconductor wafer to the air after oxygen radical or plasma annealing the high dielectric layer and to perform processes of from forming the lower electrode to oxygen radical annealing the upper electrode in-situ.

Figure 13:
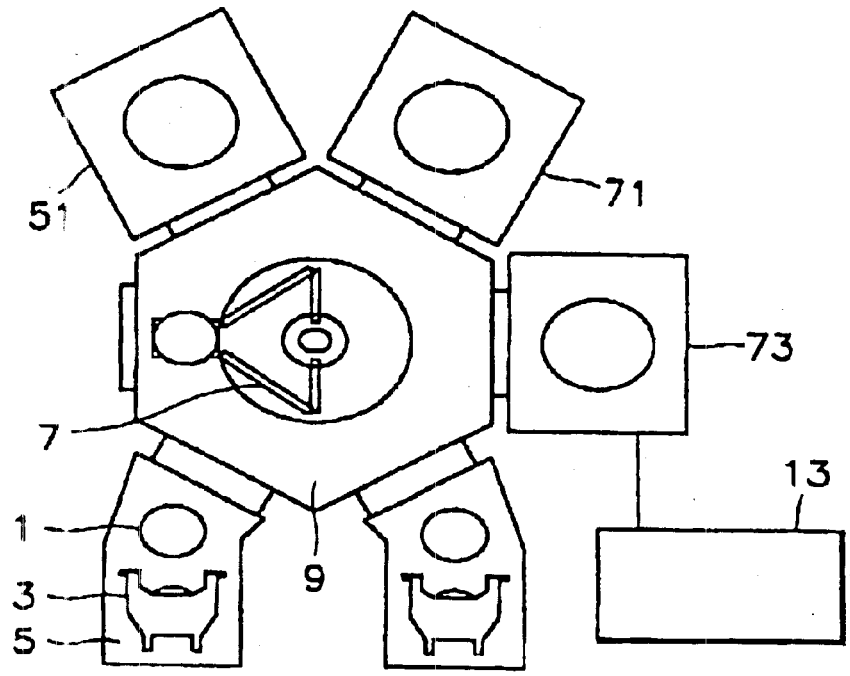
FIG. 13 is a schematic diagram illustrating embodiments of an apparatus for forming a thin film according to the present invention similar to the embodiments of FIG. 12 and having a crystallization annealing chamber.
Figure 14:
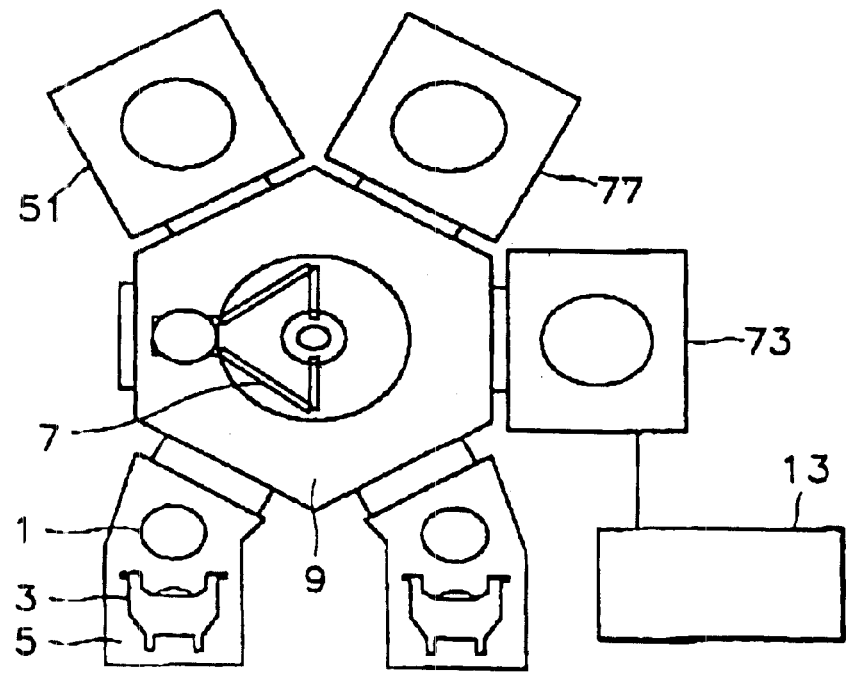
FIG. 14 is a schematic diagram illustrating embodiments of an apparatus for forming a thin film according to the present invention similar to the embodiments of FIG. 12 and having an oxygen radical or plasma annealing chamber configured to pre-treat a lower electrode.
Figure 16:
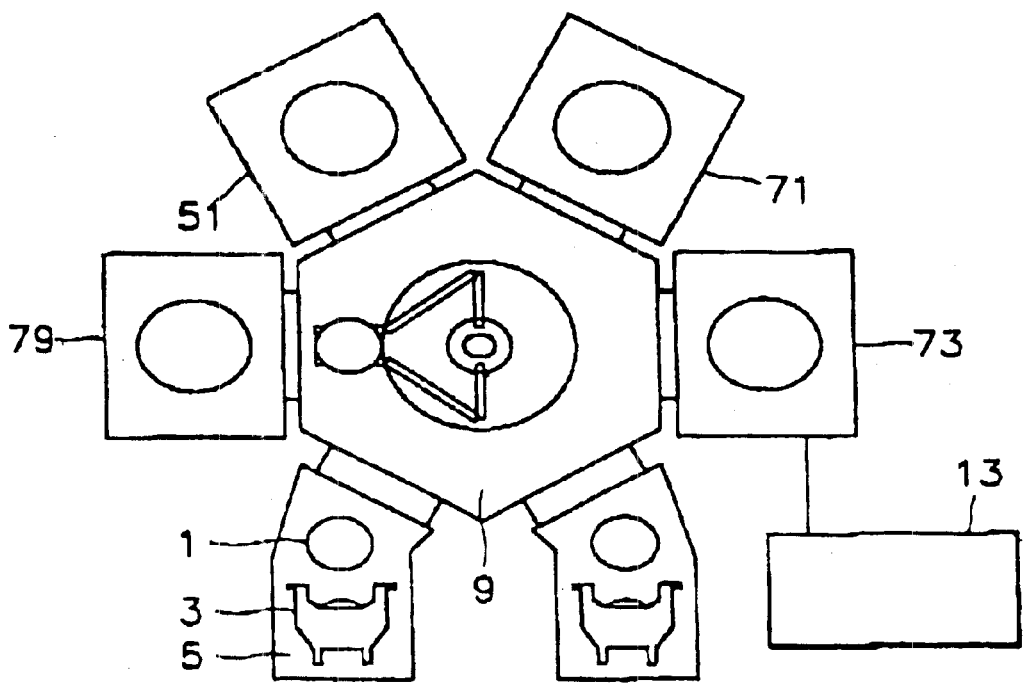
FIG. 16 is a schematic diagram illustrating embodiments of an apparatus for forming a thin film according to the present invention similar to the embodiments of FIG. 13 and having a cooling chamber.

FIGS. 13, 14 and 16 illustrate embodiments that are similar to the embodiments illustrated in FIG. 12 and further include additional chambers. In FIG. 13, the embodiments further include a crystallization annealing chamber 71 connected to the transfer chamber 9. The crystallization annealing chamber 71 is similar to the crystallization chamber described above with reference to FIG. 11, but controls temperature of the substrate between 400 and 900° C. The embodiments of FIG. 14 include an oxygen radical or plasma annealing chamber configured to pre-treat a lower electrode 77 connected to the transfer chamber 9. In FIG. 16, the embodiments further include a crystallization annealing chamber 71 as described above with reference to FIG. 11 and a cooling chamber 79, each connected to the transfer chamber 9. The cooling chamber 79 cools the semiconductor wafer 1 after processing before the semiconductor wafer enters the cassette 3. A pre-heating chamber as described below with reference to FIG. 20 may also be included.

Figure 15:
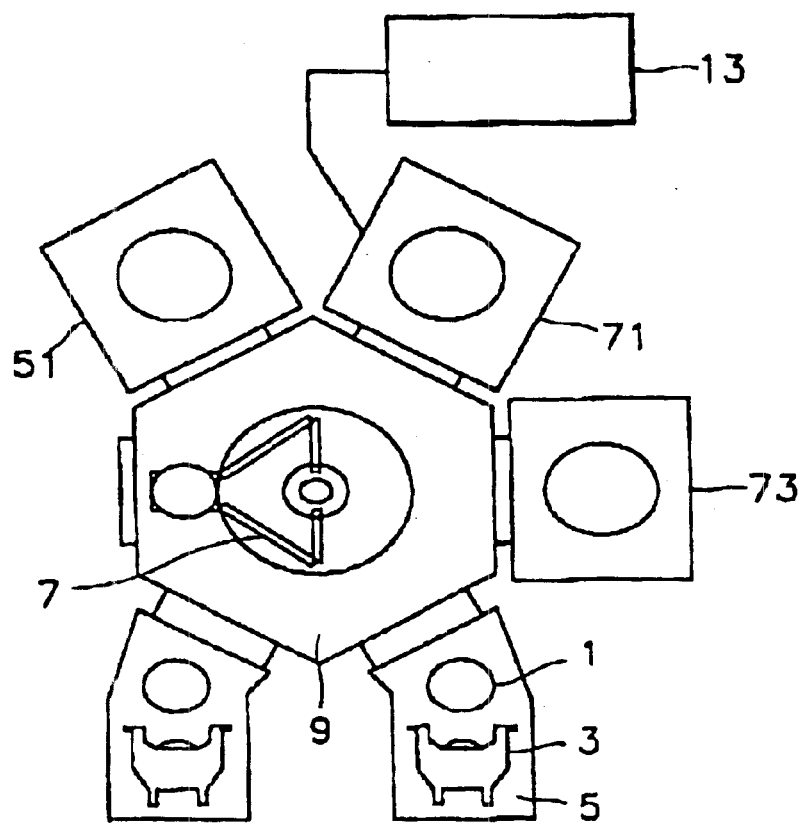
FIG. 15 is a schematic diagram illustrating embodiments of an apparatus for forming a thin film according to the present invention having a dielectric layer deposition chamber, an electrode deposition chamber, and a crystallization annealing chamber in fluid communication with an oxygen radical or plasma annealing unit.

Referring now to FIG. 15, embodiments of an apparatus for forming a thin film according to embodiments of the present invention having a dielectric layer deposition chamber, an electrode deposition chamber, and a crystallization annealing chamber connected to an oxygen radical or plasma annealing unit will now be described. The embodiments illustrated in FIG. 15 are similar to those shown in FIG. 13, except the oxygen radical or plasma annealing unit 13 is connected to the crystallization chamber 71 and not connected to the dielectric layer deposition chamber 73. Thus, the embodiments of FIG. 15 may be capable of oxygen radical annealing the upper electrode and performing crystallization annealing in one chamber, and may deposit the upper electrode in-situ without exposing the semiconductor wafer 1 to the air. Also, it may be possible to perform processes of from forming the lower electrode to oxygen radical annealing the upper electrode in-situ.

Figure 17:
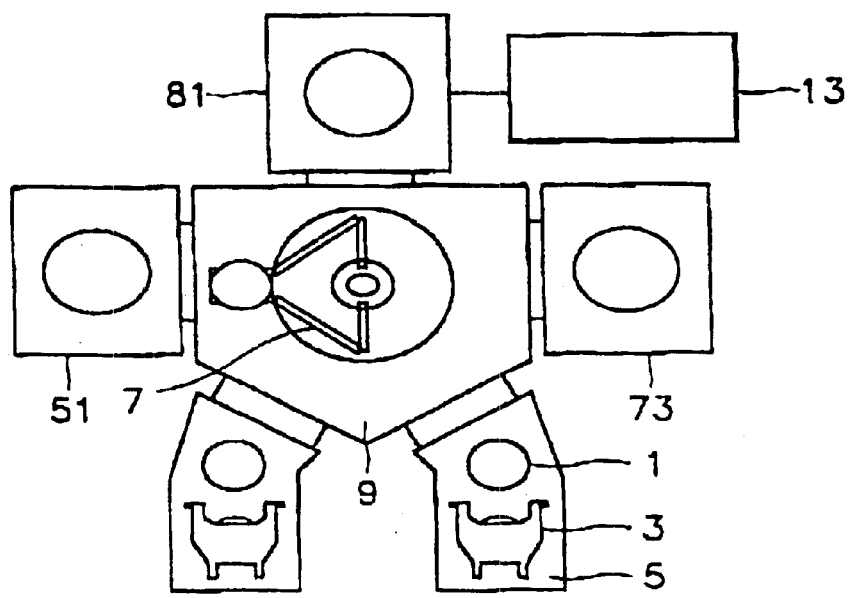
FIG. 17 is a schematic diagram illustrating embodiments of an apparatus for forming a thin film according to the present invention having a dielectric layer deposition chamber, an electrode deposition chamber, and an oxygen radical or plasma annealing chamber configured to post-treat a dielectric layer and/or an upper electrode in fluid communication with an oxygen radical or plasma annealing unit.

Referring now to FIG. 17, embodiments of an apparatus for forming a thin film according to embodiments of the present invention similar to the embodiments of FIG. 15 except having an oxygen radical or plasma annealing chamber configured to post-treat a dielectric layer in place of the crystallization annealing chamber in fluid communication with the oxygen radical or plasma annealing unit. The transfer chamber 9 is connected to the oxygen radical or plasma annealing chamber configured to post-treat a dielectric layer 81, which is connected to the oxygen radical or plasma annealing unit 13. The oxygen radical or plasma annealing chamber configured to post-treat a dielectric layer 81 can also be configured to post-treat, preferably by ozone annealing, an upper electrode. Therefore, using the embodiments illustrated in FIG. 17, it is possible to deposit and oxygen radical or plasma anneal the high dielectric layer in-situ and to perform processes of from forming the lower electrode to forming the upper electrode in-situ, which may reduce the leakage current of the capacitor.

Figure 18:
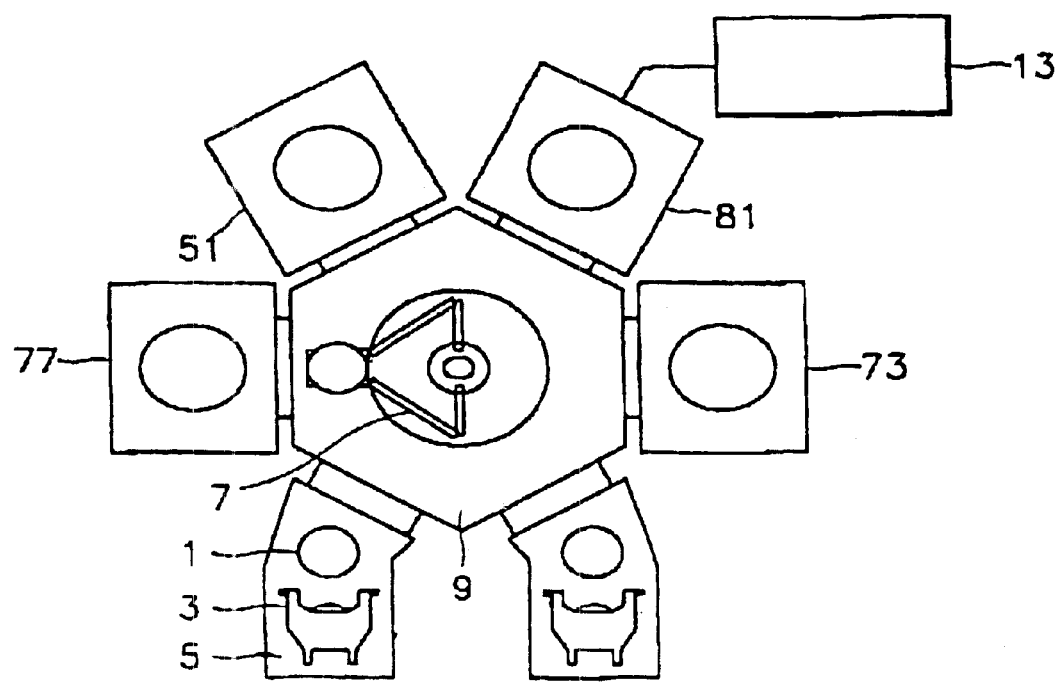
FIG. 18 is a schematic diagram illustrating embodiments of an apparatus for forming a thin film according to the present invention similar to the embodiments of FIG. 17 and having an oxygen radical or plasma annealing chamber configured to pre-treat a lower electrode.
Figure 19:
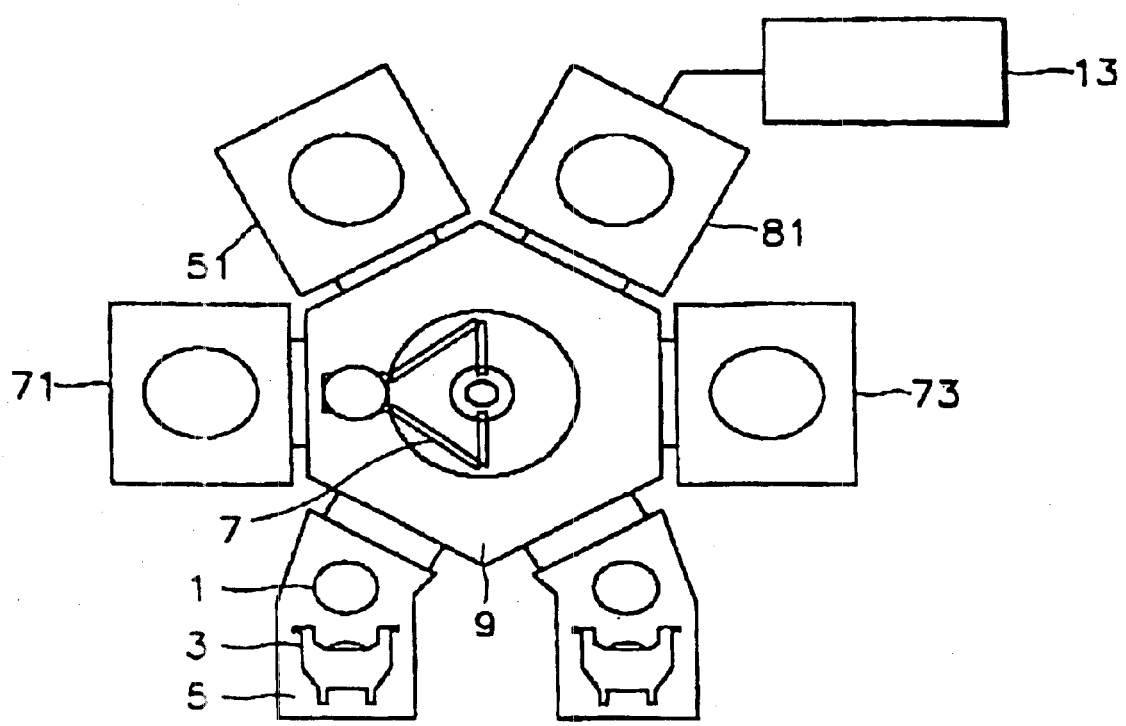
FIG. 19 is a schematic diagram illustrating embodiments of an apparatus for forming a thin film according to the present invention similar to the embodiments of FIG. 17 and having a crystallization annealing chamber.
Figure 20:
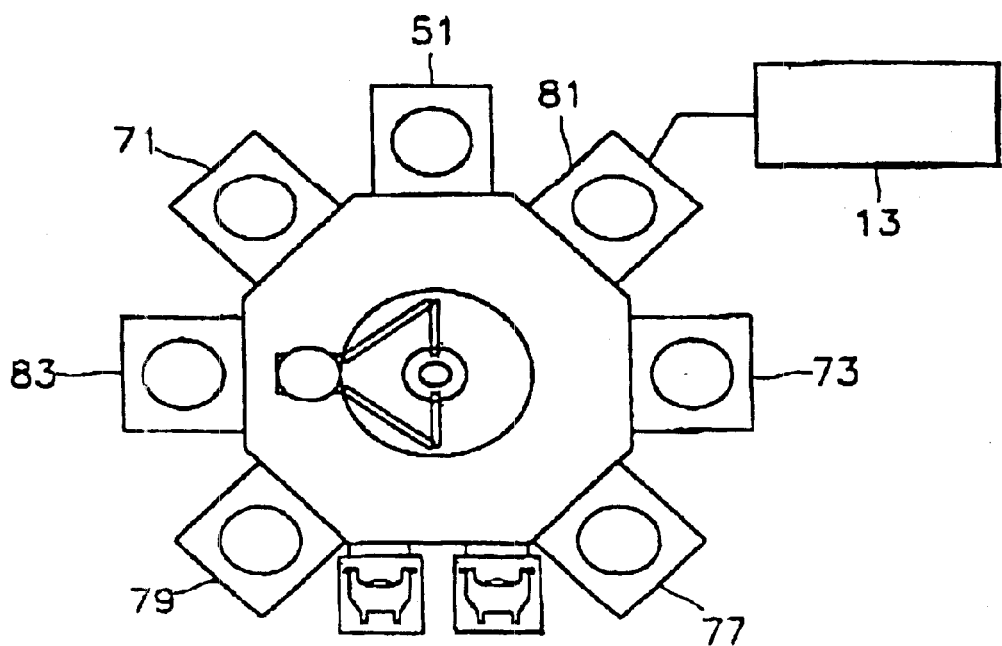
FIG. 20 is a schematic diagram illustrating embodiments of an apparatus for forming a thin film according to the present invention similar to the embodiments of FIG. 19 and an oxygen radical or plasma annealing chamber configured to pre-treat a lower electrode, a pre-heating chamber, and a cooling chamber.

FIGS. 18 through 20 illustrate embodiments similar to those shown in FIG. 17 and having additional chambers. In FIG. 18, the embodiments further include an oxygen radical or plasma anneal chamber configured to pre-treat a lower electrode 77 connected to the transfer chamber 9 and configured to oxygen radical or plasma anneal the lower electrode after forming the lower electrode. The embodiments illustrated in FIG. 19 further include a crystallization annealing chamber 71 as described above with reference to FIG. 11. In FIG. 20, the embodiments further include a crystallization annealing chamber 71, an electrode pretreatment chamber 77, a pre-heating chamber 83, and a cooling chamber 79. The pre-heating chamber 83 raises the temperature of the substrate to around the temperature at which the dielectric layer is deposited before depositing the dielectric layer. Pre-heating the substrate may reduce the time required for stabilizing the temperature of the substrate.

In FIGS. 21 through 29, methods for manufacturing capacitors on substrates using the apparatus described hereinabove will now be described. In the following embodiments, reference character a denotes processes which can be performed in one chamber of the apparatus for forming the thin film according to embodiments of the present invention and reference character b denotes processes which can be performed in-situ by the apparatus for forming the thin film according to embodiments of the present invention.

Figure 21:
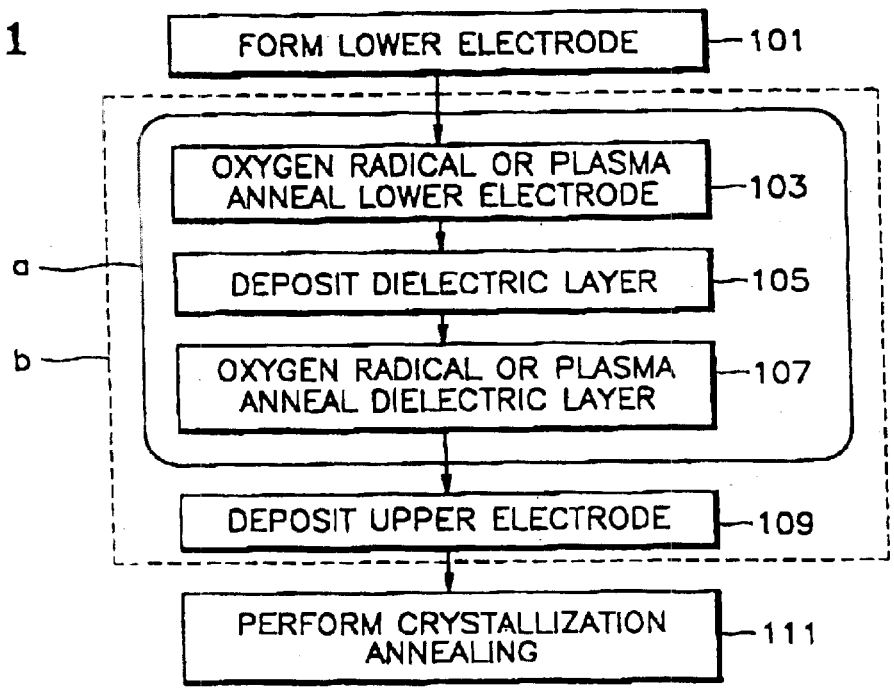
FIG. 21 is a flow diagram illustrating embodiments of a method for manufacturing a capacitor on a substrate according to the present invention where the steps of oxygen radical or plasma annealing a lower electrode, depositing a dielectric layer, and oxygen radical or plasma annealing the dielectric layer are performed in one chamber, and where the aforementioned steps and the step of depositing an upper electrode are performed in-situ.

Referring now to FIG. 21, embodiments of a method for manufacturing a capacitor on a semiconductor substrate according to the present invention where the steps of oxygen radical or plasma annealing a lower electrode, depositing a dielectric layer, and oxygen radical or plasma annealing the dielectric layer are performed in one chamber, and where the aforementioned steps and the step of depositing an upper electrode are performed in-situ will now be described. The lower electrode of the capacitor is formed on the semiconductor substrate (the semiconductor wafer) 101. The lower electrode is preferably formed to a thickness of between 50 and 10,000 Å. A Pt group metal, an oxide of the Pt group metal such as $RuO_2$, $IrO_2$, $BaRuO_3$, and $SrRuO_3$, a metal nitride, or a heat-resistant metal are preferably used as the lower electrode. The lower electrode is preferably formed of the Pt group metal such as Pt, Ru, and Ir by a sputtering method, a metal organic chemical vapor deposition (MOCVD) method, or an electroplating method.

The semiconductor substrate having a lower electrode formed thereon is moved into an apparatus of embodiments of the present invention. An operation of oxygen radical or plasma annealing the lower electrode 103 is preferably performed by positioning the semiconductor substrate on which the lower electrode is formed into a multi-functional chamber containing an atmosphere comprising oxygen radical (e.g., ozone) or plasma. When the lower electrode is oxygen radical annealed by ozone annealing, the lower electrode is preferably oxygen radical annealed in the ozone atmosphere for 5 minutes under conditions where the temperature of the substrate is between room temperature and 700° C., and more preferably between 300 and 450° C., and where the density of ozone is between 0.1 and 10 vol %. Oxygen radical annealing the lower electrode by ozone annealing may further include the operation of irradiating the lower electrode with ultraviolet (UV) rays. When the lower electrode is plasma annealed, the lower electrode is preferably plasma annealed in an ECR or RF plasma atmosphere of $N_2O$, $O_2$, $NH_3$, Ar, or $N_2$ under conditions where the temperature of the substrate is between room temperature and 500° C. and the pressure of the chamber in which the plasma annealing is performed is between 0.1 and 10 Torr. Most preferably, the lower electrode is plasma annealed for between 1 and 10 minutes using ECR plasma of $N_2O$ gas under the condition where the temperature of the substrate is 200° C.

An operation of depositing a dielectric layer 105 on the lower electrode is preferably performed by a chemical vapor deposition method or by a physical vapor deposition method such as sputtering in the multi-functional chamber. More preferably, a high dielectric layer, such as a BST layer, is deposited. The dielectric layer is preferably deposited to a thickness of between 100 and 500 Å. Most preferably, a BST layer is deposited on the lower electrode by the MOCVD method using an organic source containing $Ba(THD)_2$, $Sr(THD)_2$, and $Ti(THD)_2$ and an oxidation gas that is a mixed gas of $O_2$ and $N_2O$ under the conditions where the temperature of the substrate is between 400 and 600° C. and the pressure of the chamber is between 1 and 10 Torr.

An operation of oxygen radical or plasma annealing the dielectric layer 107 is performed in the multi-functional chamber. The dielectric layer is oxygen radical or plasma annealed in an atmosphere containing oxygen radical or plasma gas, as described above for oxygen radical or plasma annealing the lower electrode. In order to improve the effect of oxygen radical or plasma annealing the dielectric layer, the processes of depositing and oxygen radical or plasma annealing the dielectric layer can be repeated "n" times. The thickness of the high dielectric layer deposited in one cycle is preferably between 20 and 200 Å.

The oxygen radical or plasma annealed semiconductor substrate is transferred to an electrode deposition chamber. An upper electrode is deposited 109 on the oxygen radical or plasma annealed dielectric layer. The upper electrode preferably has a thickness of between 50 and 3,000 Å. The upper electrode is preferably formed using a material the same as the material of which the lower electrode is formed by a physical deposition method, such as sputtering, or by a MOCVD method. For example, the Ru layer is deposited by the MOCVD method using $Ru(EtCp)_2$ as a source under the conditions where the temperature of the substrate is between 150 and 500° C. and the pressure of the electrode deposition chamber is between 0.1 and 10 Torr.

Figure 27:
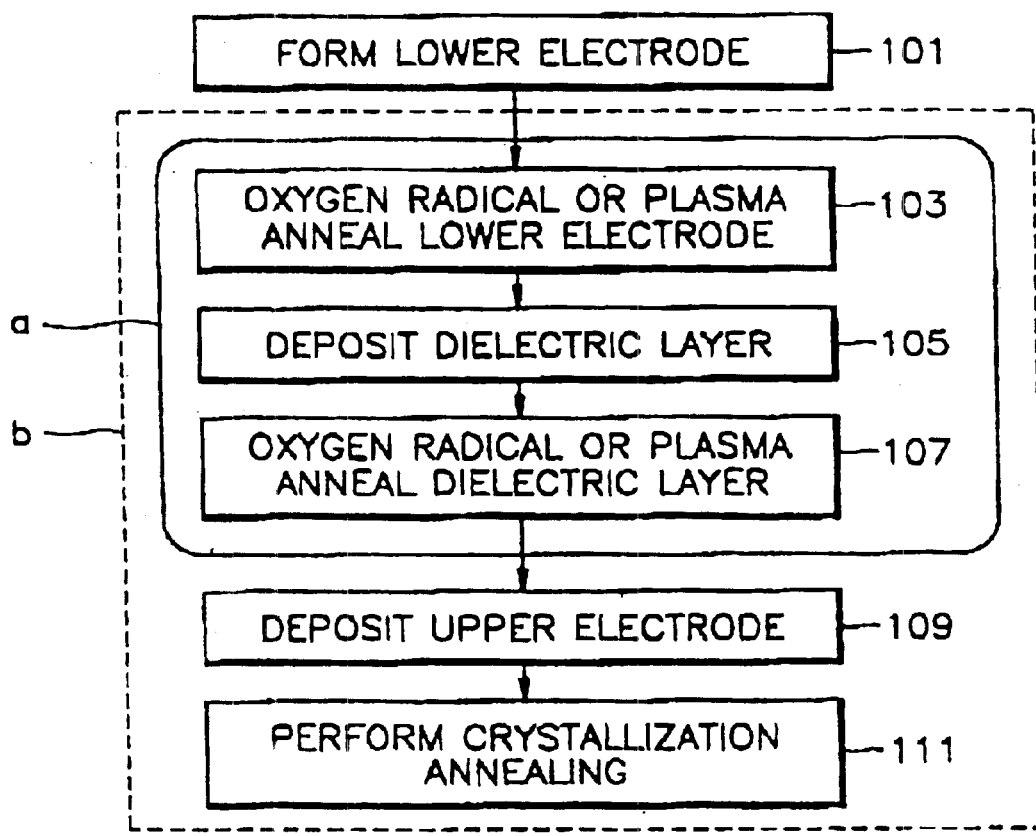
FIG. 27 is a flow diagram illustrating embodiments of a method for manufacturing a capacitor on a substrate according to the present invention similar to the embodiments of FIG. 22 where a lower electrode is formed in situ.

The semiconductor substrate on which the upper electrode is deposited is moved out of the apparatus to a crystallization annealing chamber and is crystallization annealed 111. Preferably, the BST layer is crystallization annealed at the temperature between 500 and 800° C. in an oxidative or non-oxidative atmosphere under the condition where the pressure of the chamber is between 0.1 and 10 Torr. When Ru is used as the electrode of the capacitor having a BST layer, Ru containing oxygen is oxidized. Crystallization annealing is preferably performed in an atmosphere where a small amount of oxygen is contained or in a non-oxidative atmosphere. When Pt is used as the electrode of the capacitor having a BST layer, crystallization annealing is preferably performed using a mixed gas of $O_2$ and $N_2$ containing between 1 and 10% oxygen. Crystallization annealing is preferably performed for between 30 seconds and 30 minutes at the annealing temperature of 750° C. It may take longer to perform crystallization annealing for a capacitor having a Pt electrode than for a capacitor having a Ru electrode when the temperature at which annealing is performed is lower. A rapid thermal annealing (RTA) process is preferably used in order to reduce the degree to which annealing during the formation of the capacitor affects the characteristics of other devices. In other embodiments illustrated in FIG. 22, the operation of performing crystallization annealing is performed in situ, while in still other embodiments shown in FIG. 23, crystallization annealing is not performed. In the embodiments of FIG. 27, the operations of forming a lower electrode and performing crystallization annealing are performed in situ.

Figure 24:
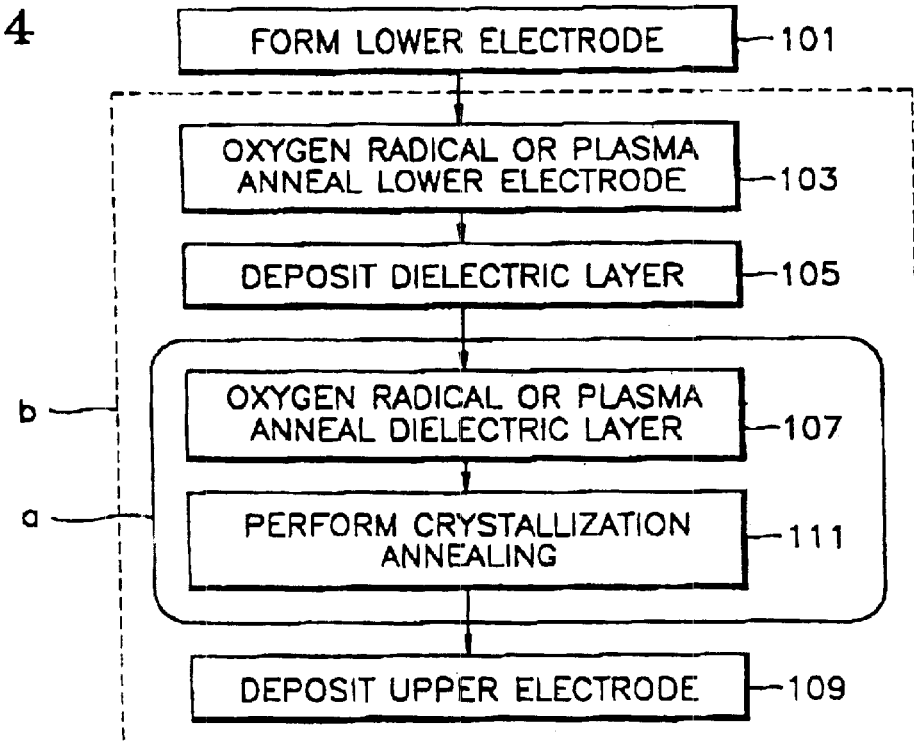
FIG. 24 is a flow diagram illustrating embodiments of a method for manufacturing a capacitor on a substrate according to the present invention where the steps of oxygen radical or plasma annealing a dielectric layer and performing crystallization annealing are performed in a multi-functional chamber, and where the aforementioned steps and the steps of oxygen radical or plasma annealing a lower electrode, depositing a dielectric layer, and depositing an upper electrode are performed in-situ.
Figure 25:
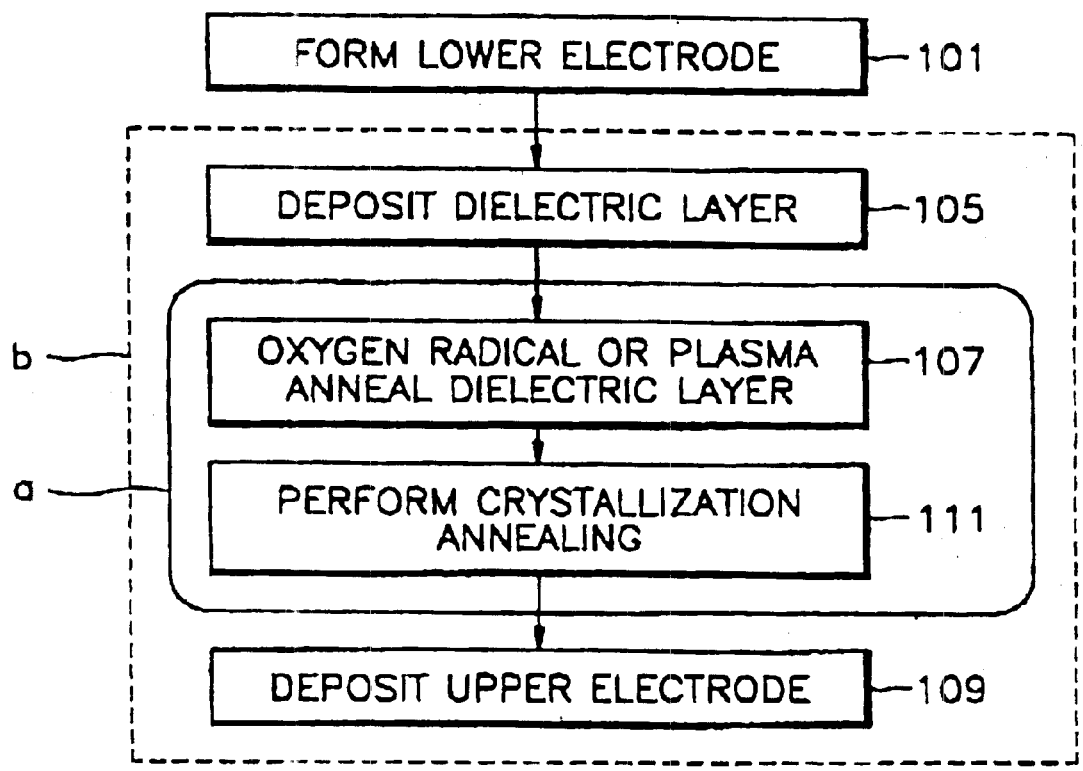
FIG. 25 is a flow diagram illustrating embodiments of a method for manufacturing a capacitor on a substrate according to the present invention similar to the embodiments of FIG. 24 except the lower electrode is not oxygen radical or plasma annealed.

The embodiments illustrate in FIG. 24 are similar to those described above with reference to FIG. 21, except the oxygen radical or plasma annealing of the lower electrode 103 and the depositing of the dielectric layer 105 are performed in separate chambers of the apparatus and the operations of oxygen radical or plasma annealing the dielectric layer 107 and performing crystallization annealing 111 are performed in a single chamber, with the crystallization annealing operation 111 being performed before depositing the upper electrode 109. FIG. 25 shows embodiments similar to those of FIG. 24 except the lower electrode is not oxygen radical or plasma annealed.

Figure 22:
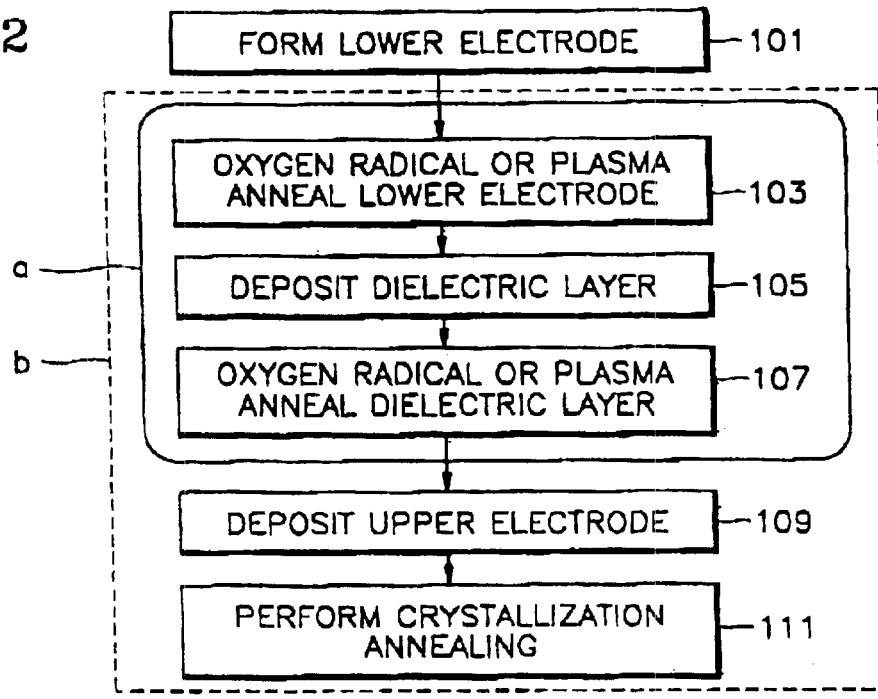
FIG. 22 is a flow diagram illustrating embodiments of a method for manufacturing a capacitor on a substrate according to the present invention similar to the embodiments of FIG. 21 and performing crystallization annealing in-situ.
Figure 26:
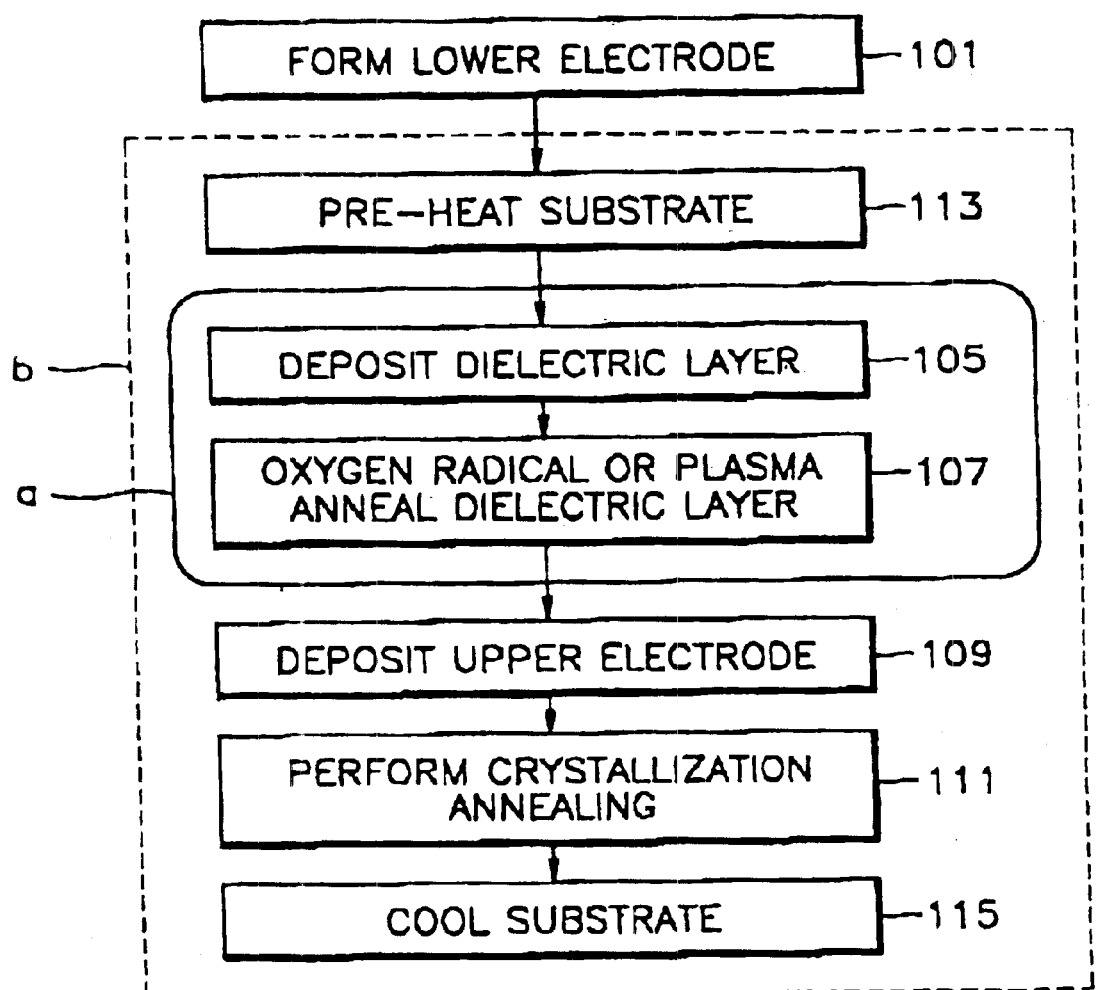
FIG. 26 is a flow diagram illustrating embodiments of a method for manufacturing a capacitor on a substrate according to the present invention similar to the embodiments of FIG. 22 except the lower electrode is not oxygen radical or plasma annealed and the substrate is pre-heated prior to dielectric deposition and cooled after crystallization annealing.

The embodiments illustrated in FIG. 26 are similar to those illustrated in FIG. 22 except the lower electrode is not oxygen radical or plasma annealed and operations of pre-heating the substrate 113 before depositing the dielectric layer 105 and cooling the substrate 115 after crystallization annealing 111 are performed. The pre-heating operation preferably raises the temperature of the substrate to the process temperature of the next step. The pre-heating operation is preferably performed within 5 minutes. The cooling operations preferably cools the substrate to room temperature within 5 minutes. The processes of from pre-heating the substrate to cooling the substrate are performed in-situ and the processes of depositing the dielectric layer and oxygen radical or plasma annealing the dielectric layer are performed in one chamber.

Figure 23:
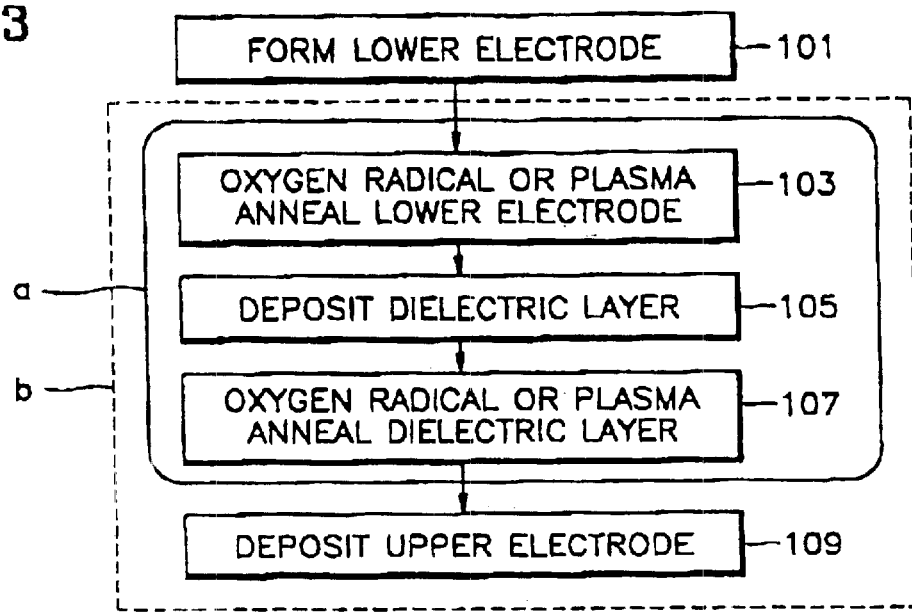
FIG. 23 is a flow diagram illustrating embodiments of a method for manufacturing a capacitor on a substrate according to the present invention similar to the embodiments of FIG. 21 and without performing crystallization annealing.
Figure 28:
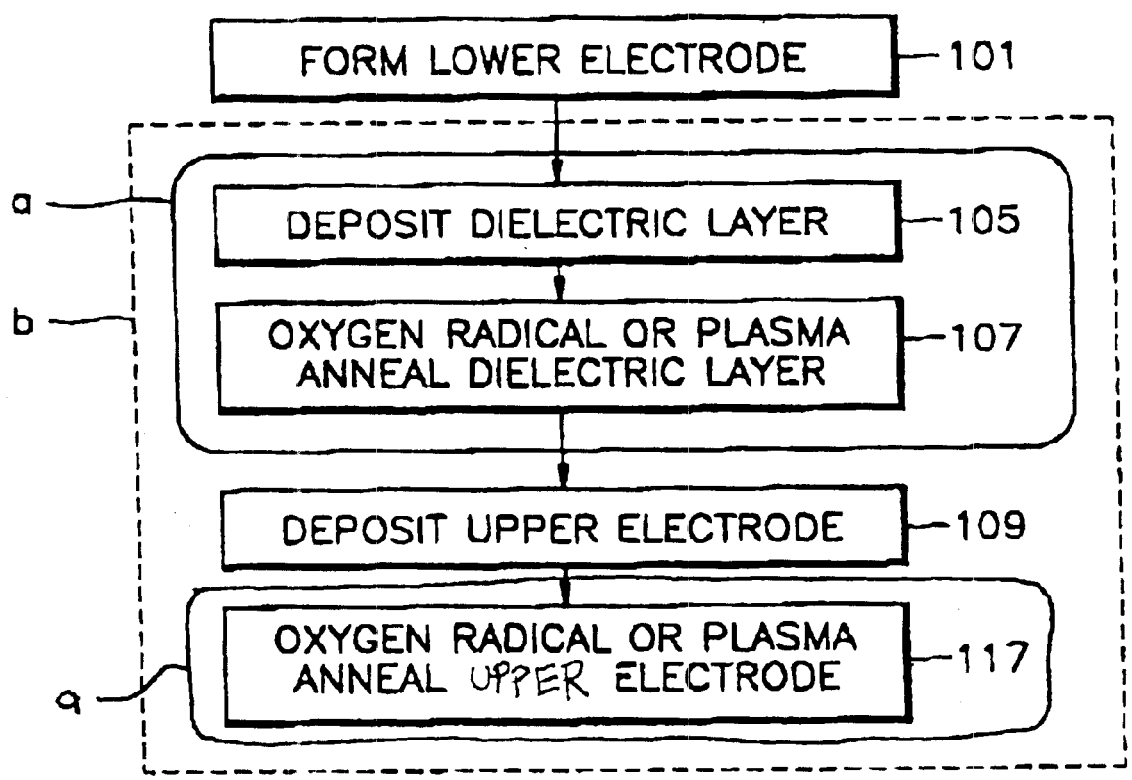
FIG. 28 is a flow diagram illustrating embodiments of a method for manufacturing a capacitor on a substrate according to the present invention similar to the embodiments of FIG. 23 except the lower electrode is not oxygen radical or plasma annealed and the upper electrode is oxygen radical annealed.

The embodiments illustrated in FIG. 28 are similar to those illustrated in FIG. 23 except the lower electrode is not oxygen radical or plasma annealed and an operation of oxygen radical annealing the upper electrode 117 is performed. The upper electrode is oxygen radical annealed in the multi-functional chamber. The upper electrode is preferably oxygen radical annealed in an atmosphere containing oxygen radical (e.g., ozone) for between about 30 seconds and 30 minutes under conditions where the temperature of the substrate is between 200 and 600° C. and the density of ozone is between 0.1 and 10 vol %. The oxygen radical annealing of the upper electrode may include irradiating the substrate with UV rays, which may also aid in reducing the leakage current of the capacitor.

Figure 29:
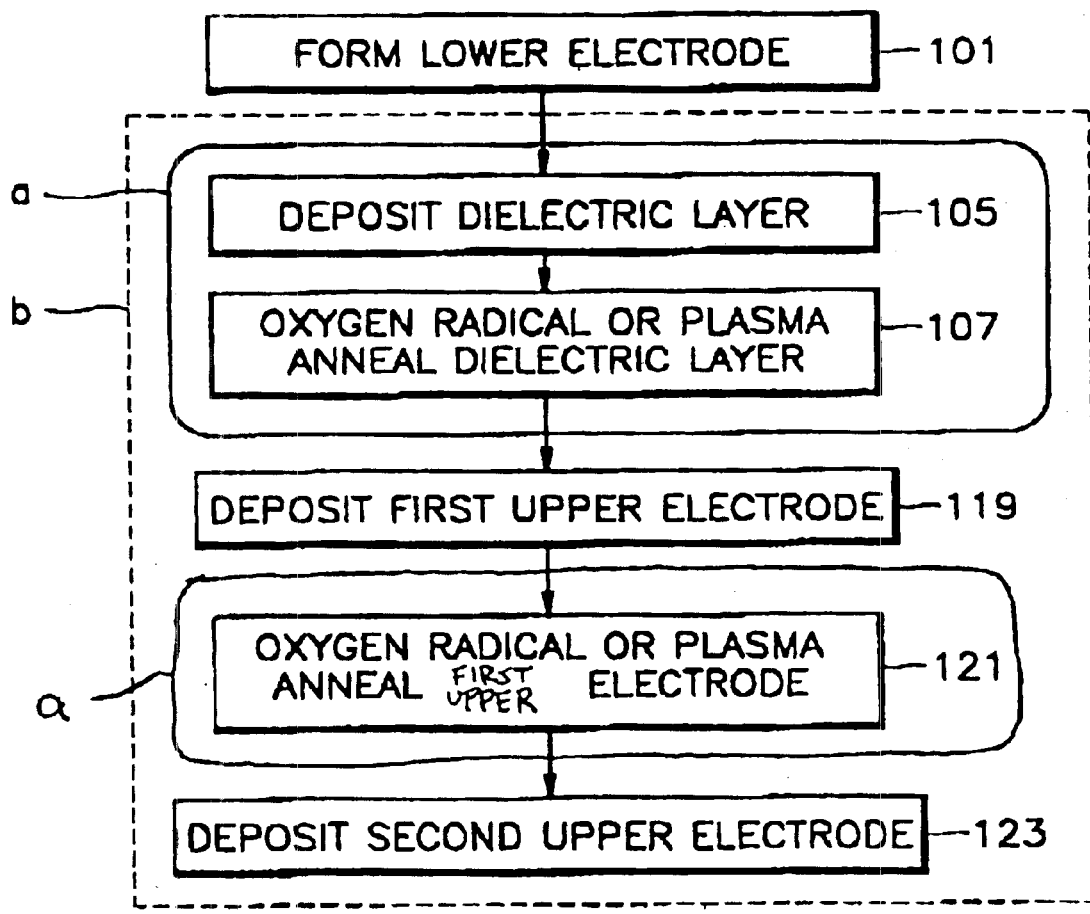
FIG. 29 is a flow diagram illustrating embodiments of a method for manufacturing a capacitor on a substrate according to the present invention similar to the embodiments of FIG. 28 where a second upper electrode is formed on the oxygen radical annealed first upper electrode.

The embodiments of FIG. 29 are similar to those illustrated in FIG. 28 except the operation of depositing the upper electrode is performed using multiple steps. A first upper electrode is deposited 119 as described above with reference to FIG. 28. The first upper electrode is preferably formed to a thickness of between 50 and 1,000 Å so that oxygen radicals may pass through the first upper electrode. Then, the first upper electrode is oxygen radical annealed 121 under the same conditions described above with reference to FIG. 28. A second upper electrode is then deposited 123 on the oxygen radical annealed first upper electrode. The second electrode preferably has a thickness of between 50 and 3,000 Å. Depositing the upper electrode in multiple steps with intervening oxygen radical annealing steps may aid in reducing the leakage current of the capacitor while increasing the thickness of the entire upper electrode.

Figure 30:
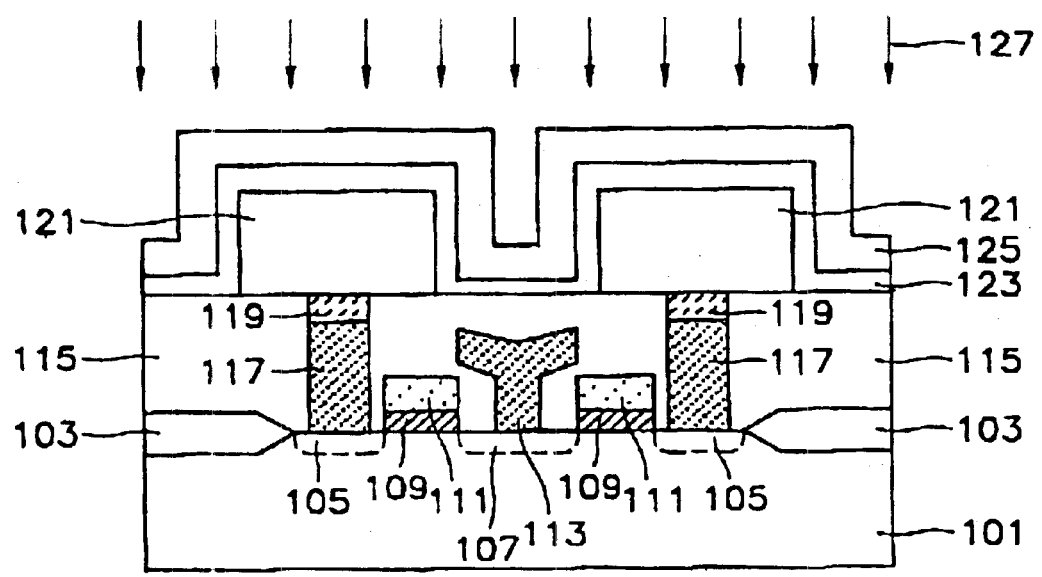
FIG. 30 is a lateral cross-section of a capacitor formed on a substrate using the embodiments of FIG. 28.

Referring now to FIG. 30, a lateral cross-section of a capacitor formed on a semiconductor substrate using the embodiments of FIG. 28 will now be described. A transistor having a source region 105, a drain region 107, and a gate electrode 111 which interposes a gate oxide layer 109 is formed in the active region of a semiconductor substrate 101 restricted by a field insulating layer 103. A bit line 113 is formed on the drain region 107. A lower electrode 121 connected to the source region 105 through a plug 117 and a barrier metal layer 119 formed in a contact hole in a interlayer dielectric layer 115 is formed in the source region 105. The lower electrode 121 is preferably formed of the Pt group metal, the oxide of the Pt group metal, the metal nitride, or the heat-resistant metal to a thickness between 50 and 10,000 Å by the sputtering method, the MOCVD method, or the electroplating method.

As shown in FIG. 30, a dielectric layer 123 and an upper electrode 125 are formed on the lower electrode 121. The dielectric layer 123 is preferably formed as a high dielectric layer containing materials such as BST, $Ta_2O_5$, $Al_2O_3$, $TiO_2$, $Y_2O_3$, $SrTiO_3$ (STO), $PbZrTiO_3$ (PZT), $SrBi_2Ta_2O_9$ (SBT), $PbZrO_3$, $LaZrO_3$, $PbTiO_3$, $LaTiO_3$, and $Bi_4Ti_3O_{12}$, as described above. The upper electrode 125 is preferably formed of the same material as the material of which the lower electrode 121 is formed by the same method as the method by which the lower electrode 121 is formed.

The leakage current of the capacitor may be reduced by oxygen radical annealing the entire surface of the upper electrode in an atmosphere containing oxygen radical (e.g., ozone) 127. As described above with reference to FIG. 29, the thickness of the upper electrode may then be increased by forming a second upper electrode on the oxygen radical annealed upper electrode 125.

According to embodiments of the present invention, it is possible to reduce the leakage current by oxygen radical or plasma annealing the lower electrode after forming the lower electrode and/or oxygen radical or plasma annealing the dielectric layer after forming the dielectric layer. The reduction in leakage current may be due to a reduction in the level of impurities in or on the various layers of the capacitor. Oxygen radical (e.g., ozone) annealing the upper electrode after forming the upper electrode has been found to reduce the leakage current of the capacitor, which reduction may be caused by a decrease in the number of oxygen vacancies in the high dielectric layer. The apparatus for forming a thin film of embodiments of the present invention may reduce or prevent absorption of impurities on the lower electrode or the high dielectric electrode by reducing the exposure of the substrate to air during the processing steps. Accordingly, the apparatus of embodiments of the present invention may reduce the leakage current of the capacitor.

In the drawings and specification, there have been disclosed typical preferred embodiments of the invention and, although specific terms are employed, they are used in a That which is claimed is:

1. A method for forming a capacitor on a substrate, comprising the steps of:
   forming a lower electrode on a substrate;
   forming a dielectric layer on the lower electrode;
   plasma annealing the dielectric layer, wherein the steps of forming a dielectric layer and plasma annealing the dielectric layer are performed in the same chamber; and
   forming an upper electrode on the plasma annealed dielectric layer.

2. The method of claim 1, wherein the step of plasma annealing the dielectric layer comprises the step of oxygen radical annealing the dielectric layer by exposing the dielectric layer to an atmosphere comprising an oxygen radical.

3. The method of claim 2, wherein the step of oxygen radical annealing the dielectric layer further comprises the step of maintaining the temperature of the dielectric layer equal to or less than 500° C. during the exposing step.

4. The method of claim 2, wherein the oxygen radical is generated from ozone.

5. The method of claim 1, wherein the step of plasma annealing the dielectric layer comprises the step of plasma annealing the dielectric layer by exposing the dielectric layer to an atmosphere comprising a plasma gas generated from a gas selected from the group consisting of $O_2$, $NH_3$, Ar, $N_2$, and $N_2O$.

6. The method of claim 1, wherein the step of plasma annealing the dielectric layer further comprises the step of maintaining the temperature of the dielectric layer equal to or less than 500° C. during the exposing step.

7. A method for forming a capacitor on a substrate, comprising the steps of:
   forming a lower electrode on a substrate;
   forming a dielectric layer on the lower electrode;
   plasma annealing the dielectric layer; and
   forming an upper electrode on the plasma annealed dielectric layer, wherein the steps of forming and plasma annealing the dielectric layer are performed repeatedly.

8. The method of claim 1, wherein the dielectric layer consists of a material selected from a group consisting of $Ta_2O_5$, $Al_2O_3$, $TiO_2$, $Y_2O_3$, $SrTiO_3$, $BaTiO_3$, $SrTiO_3$, $PbZrTiO_3$, $SrBi_2Ta_2O_9$, $PbZrO_3$, $LaZrO_3$, $PbTiO_3$, $LaTiO_3$, and $Bi_4Ti_3O_{12}$.

9. The method of claim 1, further comprising the step of plasma annealing the lower electrode.

10. The method of claim 9, wherein the steps of plasma annealing the lower electrode, depositing the dielectric layer, and plasma annealing the dielectric layer are performed in the same chamber.

11. The method of claim 9, wherein the steps of plasma annealing the lower electrode, forming the dielectric layer, annealing the dielectric layer, and forming the upper electrode are performed in-situ by one apparatus for forming a thin film.

12. The method of claim 9, further comprising the step of crystallization annealing the dielectric layer after forming the upper electrode.

13. The method of claim 12, wherein the steps of plasma annealing the lower electrode, forming the dielectric layer, plasma annealing the dielectric layer, forming the upper electrode, and crystallization annealing the dielectric layer are performed in-situ by one apparatus for forming a thin film.

14. The method of claim 1, further comprising the step of crystallization annealing the dielectric layer after plasma annealing the dielectric layer.

15. The method of claim 14, wherein the steps of plasma annealing the dielectric layer and crystallization annealing the dielectric layer are performed in the same chamber.

16. The method of claim 14, wherein the steps of forming the dielectric layer, plasma annealing the dielectric layer, crystallization annealing the dielectric layer, and forming the upper electrode are performed in-situ by one apparatus for forming a thin film.

17. A method for forming a capacitor on a substrate, comprising the steps of:
   forming a lower electrode on a substrate;
   forming a dielectric layer on the lower electrode;
   forming a first upper electrode on the dielectric layer; and
   oxygen radical annealing the first upper electrode, wherein the steps of forming the first upper electrode and oxygen radical annealing the first upper electrode are performed in the same chamber.

18. The method of claim 17, wherein the oxygen radical annealing step comprises exposing the first upper electrode to an atmosphere comprising ozone.

19. The method of claim 18, wherein the oxygen radical annealing step further comprises maintaining the temperature of the first upper electrode at equal to or less than 500° C. during the exposing step.

20. The method of claim 17, wherein the dielectric layer comprises a material selected from the group consisting of $Ta_2O_5$, $Al_2O_3$, $TiO_2$, $Y_2O_3$, $SrTiO_3$, $BaTiO_3$, $SrTiO_3$, $PbZrTiO_3$, $SrBi_2Ta_2O_9$, $PbZrO_3$, $LaZrO_3$, $PbTiO_3$, $LaTiO_3$, and $Bi_4Ti_3O_{12}$.

21. The method of claim 20, further comprising the step of forming a second upper electrode on the oxygen radical annealed first upper electrode.

* * * * *